(12) United States Patent
Rhodes et al.

(10) Patent No.: US 10,266,720 B2
(45) Date of Patent: Apr. 23, 2019

(54) POLYCYCLOOLEFIN POLYMER COMPOSITIONS AS OPTICAL MATERIALS

(71) Applicant: PROMERUS, LLC, Brecksville, OH (US)

(72) Inventors: Larry F Rhodes, Brecksville, OH (US); Hugh A Burgoon, Brecksville, OH (US)

(73) Assignee: PROMERUS, LLC, Brecksville, OH (US)

( * ) Notice: Subject to any disclaimer, the term of this patent is extended or adjusted under 35 U.S.C. 154(b) by 0 days.

(21) Appl. No.: 15/913,337

(22) Filed: Mar. 6, 2018

(65) Prior Publication Data
US 2018/0194962 A1 Jul. 12, 2018

Related U.S. Application Data

(63) Continuation of application No. 15/253,980, filed on Sep. 1, 2016, now Pat. No. 9,944,818.

(60) Provisional application No. 62/212,919, filed on Sep. 1, 2015, provisional application No. 62/251,206, filed on Nov. 5, 2015.

(51) Int. Cl.
| | |
|---|---|
| *C08F 232/00* | (2006.01) |
| *C08F 232/08* | (2006.01) |
| *C09D 4/00* | (2006.01) |
| *C09D 165/00* | (2006.01) |
| *C09D 167/02* | (2006.01) |
| *C08G 61/02* | (2006.01) |
| *C08G 63/189* | (2006.01) |
| *C09D 145/00* | (2006.01) |

(52) U.S. Cl.
CPC .......... *C09D 165/00* (2013.01); *C08F 232/00* (2013.01); *C08F 232/08* (2013.01); *C08G 61/02* (2013.01); *C08G 63/189* (2013.01); *C09D 145/00* (2013.01); *C09D 167/02* (2013.01); *C08G 2261/12* (2013.01); *C08G 2261/312* (2013.01); *C08G 2261/3325* (2013.01)

(58) Field of Classification Search
None
See application file for complete search history.

(56) References Cited

U.S. PATENT DOCUMENTS

| | | |
|---|---|---|
| 8,053,166 B2 | 11/2011 | Choki et al. |
| 2015/0079507 A1 | 3/2015 | Kandanarachchi et al. |

FOREIGN PATENT DOCUMENTS

| | | |
|---|---|---|
| EP | 2 676 978 A1 | 12/2013 |
| WO | WO 2014/044359 A1 | 3/2014 |

*Primary Examiner* — Vu A Nguyen
(74) *Attorney, Agent, or Firm* — Balaram Gupta

(57) ABSTRACT

Embodiments in accordance with the present invention encompass compositions encompassing components A and B which are kept separately and respectively contain a procatalyst and an activator along with one or more monomers which undergo vinyl addition polymerization when both components are mixed together to form a substantially transparent film. The monomers employed therein have a range of refractive index from 1.4 to 1.8 and thus these compositions can be tailored to form transparent films of varied refractive indices. Accordingly, compositions of this invention are useful in various opto-electronic applications, including as coatings, encapsulants, fillers, leveling agents, among others.

20 Claims, No Drawings

POLYCYCLOOLEFIN POLYMER COMPOSITIONS AS OPTICAL MATERIALS

CROSS REFERENCE TO RELATED APPLICATIONS

This application is a continuation of U.S. application Ser. No. 15/253,980, filed Sep. 1, 2016, now allowed, which claims the benefit of U.S. Provisional Application No. 62/212,919, filed Sep. 1, 2015, and U.S. Provisional Application No. 62/251,206, filed Nov. 5, 2015; all of which are incorporated herein by reference in their entirety.

BACKGROUND OF THE INVENTION

Field of the Invention

Embodiments in accordance with the present invention relate generally to mass polymerizable polycycloolefin monomer compositions having high optical transparency and exhibiting suitable refractive index that match the refractive index of layers in optical devices, such as optical sensors, light emitting diodes (LEDs), organic light emitting diode (OLED), among other devices. More specifically, this invention relates to compositions encompassing norbornene (NB) based olefinic monomers, which undergo mass polymerization to form optical layers having utility in a variety of opto-electronic applications including as encapsulants, coatings, and fillers.

Description of the Art

Organic light emitting diodes (OLEDs) are gaining importance in a variety of applications, including flat panel televisions and other flexible displays, among other applications. However, conventional OLEDs, particularly, bottom emitting OLEDs suffer from a drawback in that only about half of the generated photons are emitted into the glass substrate out of which 25% are extracted into air. The other half of the photons are wave-guided and dissipated in the OLED stack. This loss of photons is primarily attributed to the refractive index (n) mismatch between the organic layers (n=1.7-1.9) and the glass substrate (n=1.5). By matching the refractive index of the substrate (n=1.8) and organic layers and augmenting the distance of the emission zone to the cathode to suppress plasmonic losses light extraction into the substrate can be increased to 80-90%. See, for example, G. Gaertner et al., Proc. of SPIE, Vol. 6999, 69992T pp 1-12 (2008).

In addition, OLEDs also pose other challenges; in that OLEDs being organic materials, they are generally sensitive to moisture, oxygen, temperature, and other harsh conditions. Thus, it is imperative that OLEDs are protected from such harsh atmospheric conditions. See for example, U. S. Patent Application Publication No. US2012/0009393 A1.

In order to address some of the issues faced by the art, U.S. Pat. No. 8,263,235 discloses use of a light emitting layer formed from at least one organic light emitting material and an aliphatic compound not having an aromatic ring, and a refractive index of the light emitting from 1.4 to 1.6. The aliphatic compounds described therein are generally a variety of polyalkyl ethers, and the like, which are known to be unstable at high temperatures, see for example, Rodriguez et al., I & EC Product Research and Development, Vol. 1, No. 3, 206-210 (1962).

Accordingly, there is still a need for organic filler materials that complement the refractive index of OLEDs and yet exhibit high transparence and high thermal properties, among other desirable properties.

Thus, it is an object of this invention to provide organic materials that overcome the gaps faced by the art. More specifically, it is an object of this invention to provide two component materials that will mass polymerize under the conditions of the fabrications of an OLED devices.

Other objects and further scope of the applicability of the present invention will become apparent from the detailed description that follows.

SUMMARY OF THE INVENTION

It has now been found that by employing a two component filler composition, it is possible to fabricate an OLED device having a transparent optical layer which features hitherto unachievable properties, i.e., refractive index in the range of 1.4 to 1.7, high colorless optical transparency, desirable film thickness of the filler layer typically in the range of 10 to 20 µm but can be tailored to lower or higher film thickness depending upon the intended application, compatible with the OLED stack, particularly the cathode layer (a very thin layer on the top of the OLED stack), compatible with polymerization of the formulation on the OLED stack, including fast polymerization time and can be thermally treated at less than 100° C., adhesion to both OLED stack and glass cover, among other enhanced properties. It is also important to note that the compositions of this invention are expected to exhibit good uniform leveling across the OLED layer which typically requires a low viscosity. Further compositions of this invention are also expected to exhibit low shrinkage due to their rigid polycycloolefinic structure. In addition, as the components of this invention undergo fast mass polymerization upon application they do not leave behind any fugitive small molecules which can damage the OLED stack. Generally, no other small molecule additives need to be employed thus offering additional advantages.

Advantageously, the compositions of this invention are also compatible with a "one drop fill" (commonly known as "ODF"). In a typical ODF process, which is commonly used to fabricate a top emission OLED device, a special optical fluid is applied to enhance the transmission of light from the device to the top cover glass, and the fluid is dispensed by an ODF method. Although the method is known as ODF which can be misleading because several drops or lines of material are generally dispensed inside the seal lines. After applying the fluid, the fluid spreads out as the top glass is laminated, analogous to die-attach epoxy. This process is generally carried out under vacuum to prevent air entrapment. The present invention allows for a material of low viscosity which readily and uniformly coats the substrate with rapid flow in a short period of time.

Accordingly, there is provided a composition encompassing a Component A and a Component B, wherein each of Component A and Component B comprises one or more monomers of formula (I) or formula (II) and wherein Component A further comprises a procatalyst and Component B further comprises an activator, wherein:

a) the monomer of formula (I) is:

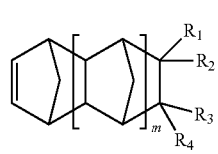

(I)

wherein:

m is an integer 0, 1 or 2;

at least one of $R_1$, $R_2$, $R_3$ and $R_4$ is a group of formula (A):

—X-Aryl  (A)

wherein:

X is selected from the group consisting of:
O, CO, C(O)O, OC(O), OC(O)O, S, $(CR_5R_6)_a$, $O(CR_5R_6)_a$, $(CR_5R_6)_aO$, $(CR_5R_6)_aO(SiR_5R_6)_a$, $(CR_5R_6)_aO(CR_5R_6)_a$, $C(O)(CR_5R_6)_a$, $(SiR_5R_6)_aO(SiR_5R_6)_a$, $(CR_5R_6)_aC(O)$, $C(O)O(CR_5R_6)_a$, $(CR_5R_6)_aC(O)O$, $OC(O)(CR_5R_6)_a$, $(CR_5R_6)_aOC(O)$, $(CR_5R_6)_aOC(O)O$, $(CR_5R_6)_aOC(O)O(CR_5R_6)_a$, $OC(O)O(CR_5R_6)_a$, $S(CR_5R_6)_a$, $(CR_5R_6)_aS$, $(SiR_5R_6)_a$, $O(SiR_5R_6)_a$, and $(SiR_5R_6)_aO$, where $R_5$ and $R_6$ are the same or different and each independently represents hydrogen, methyl, ethyl, linear or branched ($C_3$-$C_{12}$)alkyl and ($C_6$-$C_{10}$)aryl, and a is an integer from 0 to 12, inclusive;

Aryl is substituted or unsubstituted phenyl, substituted or unsubstituted biphenyl, substituted or unsubstituted naphthyl substituted or unsubstituted terphenyl, substituted or unsubstituted anthracenyl and substituted or unsubstituted fluorenyl;

the remaining $R_1$, $R_2$, $R_3$ and $R_4$ are the same or different and each independently represents hydrogen, halogen, a hydrocarbyl or halohydrocarbyl group selected from the group consisting of methyl, ethyl, linear or branched ($C_3$-$C_{12}$)alkyl, perfluoro($C_1$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_6$)alkyl, perfluoro($C_6$-$C_{10}$)aryl and perfluoro($C_6$-$C_{10}$)aryl($C_1$-$C_3$) alkyl;

b) the monomer of formula (II) is:

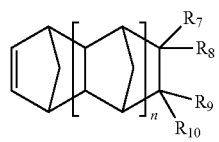

(II)

wherein:

n is an integer 0, 1 or 2;

$R_7$, $R_8$, $R_9$ and $R_{10}$ are the same or different and each independently selected from the group consisting of hydrogen, halogen, a hydrocarbyl or halohydrocarbyl group selected from methyl, ethyl, linear or branched ($C_3$-$C_{10}$)alkyl, perfluoro($C_1$-$C_{12}$)alkyl, ($C_3$-$C_{12}$)cycloalkyl, ($C_6$-$C_{12}$)bicycloalkyl, ($C_7$-$C_{14}$)tricycloalkyl, ($C_6$-$C_{10}$)aryl, ($C_6$-$C_{10}$)aryl($C_1$-$C_6$)alkyl, perfluoro($C_6$-$C_{10}$)aryl, perfluoro($C_6$-$C_{10}$)aryl($C_1$-$C_3$)alkyl and a group of formula (B):

—Y-Aryl)  (B)

wherein:

Y is selected from the group consisting of:
$(CR_5R_6)_a$, $O(CR_5R_6)_a$ and $(CR_5R_6)_aO$, where a, $R_5$ and $R_6$ are as defined above;

$Aryl_1$ is phenyl or phenyl substituted with one or more ($C_1$-$C_6$)alkyl;

and wherein said monomer of formula (I) is having a refractive index greater than or equal to 1.6 and said Component A and Component B are in a clear liquid form at room temperature.

In another aspect of this invention there is also provided a kit encompassing the Component A and Component B of the compositions of this invention for forming a transparent film.

DETAILED DESCRIPTION

The terms as used herein have the following meanings:

As used herein, the articles "a," "an," and "the" include plural referents unless otherwise expressly and unequivocally limited to one referent.

Since all numbers, values and/or expressions referring to quantities of ingredients, reaction conditions, etc., used herein and in the claims appended hereto, are subject to the various uncertainties of measurement encountered in obtaining such values, unless otherwise indicated, all are to be understood as modified in all instances by the term "about."

Where a numerical range is disclosed herein such range is continuous, inclusive of both the minimum and maximum values of the range as well as every value between such minimum and maximum values. Still further, where a range refers to integers, every integer between the minimum and maximum values of such range is included. In addition, where multiple ranges are provided to describe a feature or characteristic, such ranges can be combined. That is to say that, unless otherwise indicated, all ranges disclosed herein are to be understood to encompass any and all sub-ranges subsumed therein. For example, a stated range of from "1 to 10" should be considered to include any and all sub-ranges between the minimum value of 1 and the maximum value of 10. Exemplary sub-ranges of the range 1 to 10 include, but are not limited to, 1 to 6.1, 3.5 to 7.8, and 5.5 to 10, etc.

As used herein, the symbol "〰" denotes a position at which the bonding takes place with another repeat unit or another atom or molecule or group or moiety as appropriate with the structure of the group as shown.

As used herein, "hydrocarbyl" refers to a group that contains carbon and hydrogen atoms, non-limiting examples being alkyl, cycloalkyl, aryl, aralkyl, alkaryl, and alkenyl. The term "halohydrocarbyl" refers to a hydrocarbyl group where at least one hydrogen has been replaced by a halogen. The term perhalocarbyl refers to a hydrocarbyl group where all hydrogens have been replaced by a halogen.

As used herein, the expression "($C_1$-$C_6$)alkyl" includes methyl and ethyl groups, and straight-chained or branched propyl, butyl, pentyl and hexyl groups. Particular alkyl groups are methyl, ethyl, n-propyl, isopropyl and tert-butyl. Derived expressions such as "($C_1$-$C_4$)alkoxy", "($C_1$-$C_4$)thioalkyl", "($C_1$-$C_4$)alkoxy($C_1$-$C_4$)alkyl", "hydroxy($C_1$-$C_4$)alkyl", "($C_1$-$C_4$)alkylcarbonyl", "($C_1$-$C_4$)alkoxycarbonyl ($C_1$-$C_4$)alkyl", "($C_1$-$C_4$)alkoxycarbonyl", "amino($C_1$-$C_4$)alkyl", "($C_1$-$C_4$)alkylamino", "($C_1$-$C_4$)alkylcarbamoyl($C_1$-$C_4$)alkyl", "($C_1$-$C_4$)dialkylcarbamoyl($C_1$-$C_4$)alkyl", "mono- or di-($C_1$-$C_4$)alkylamino($C_1$-$C_4$)alkyl", "amino($C_1$-$C_4$)alkylcarbonyl" "diphenyl($C_1$-$C_4$)alkyl", "phenyl($C_1$-$C_4$)alkyl", "phenylcarbonyl($C_1$-$C_4$)alkyl" and "phenoxy($C_1$-$C_4$)alkyl" are to be construed accordingly.

As used herein, the expression "cycloalkyl" includes all of the known cyclic groups. Representative examples of "cycloalkyl" includes without any limitation cyclopropyl, cyclobutyl, cyclopentyl, cyclohexyl, cycloheptyl, cyclooctyl, and the like. Derived expressions such as "cycloalkoxy", "cycloalkylalkyl", "cycloalkylaryl", "cycloalkylcarbonyl" are to be construed accordingly.

As used herein, the expression "($C_1$-$C_6$)perfluoroalkyl" means that all of the hydrogen atoms in said alkyl group are replaced with fluorine atoms. Illustrative examples include trifluoromethyl and pentafluoroethyl, and straight-chained or branched heptafluoropropyl, nonafluorobutyl, undecafluoropentyl and tridecafluorohexyl groups. Derived expression, "($C_1$-$C_6$)perfluoroalkoxy", is to be construed accordingly. It should further be noted that certain of the alkyl groups as described herein, such as for example, "($C_1$-$C_6$) alkyl" may partially be fluorinated, that is, only portions of the hydrogen atoms in said alkyl group are replaced with fluorine atoms and shall be construed accordingly.

As used herein, the expression "($C_6$-$C_{10}$)aryl" means substituted or unsubstituted phenyl or naphthyl. Specific examples of substituted phenyl or naphthyl include o-, p-, m-tolyl, 1,2-, 1,3-, 1,4-xylyl, 1-methylnaphthyl, 2-methylnaphthyl, etc. "Substituted phenyl" or "substituted naphthyl" also include any of the possible substituents as further defined herein or one known in the art.

As used herein, the expression "($C_6$-$C_{10}$)aryl($C_1$-$C_4$) alkyl" means that the ($C_6$-$C_{10}$)aryl as defined herein is further attached to ($C_1$-$C_4$)alkyl as defined herein. Representative examples include benzyl, phenylethyl, 2-phenylpropyl, 1-naphthylmethyl, 2-naphthylmethyl and the like.

"Halogen" or "halo" means chloro, fluoro, bromo, and iodo.

In a broad sense, the term "substituted" is contemplated to include all permissible substituents of organic compounds. In a few of the specific embodiments as disclosed herein, the term "substituted" means substituted with one or more substituents independently selected from the group consisting of $C_{1-6}$alkyl, $C_{2-6}$alkenyl, $C_{1-6}$perfluoroalkyl, phenyl, hydroxy, —$CO_2$H, an ester, an amide, $C_1$-$C_6$alkoxy, $C_1$-$C_6$thioalkyl, $C_1$-$C_6$perfluoroalkoxy, —$NH_2$, Cl, Br, I, F, —NH-lower alkyl, and —N(lower alkyl)$_2$. However, any of the other suitable substituents known to one skilled in the art can also be used in these embodiments.

It should be noted that any atom with unsatisfied valences in the text, schemes, examples and tables herein is assumed to have the appropriate number of hydrogen atom(s) to satisfy such valences.

As used herein, the term "modulus" is understood to mean the ratio of stress to strain and unless otherwise indicated, refers to the Young's Modulus or Tensile Modulus measured in the linear elastic region of the stress-strain curve. Modulus values are generally measured in accordance with ASTM method DI708-95. Films having a low modulus are understood to also have low internal stress.

By the term "derived" is meant that the polymeric repeating units are polymerized (formed) from, for example, polycyclic norbornene-type monomers in accordance with formulae (I) to (IV) wherein the resulting polymers are formed by 2,3 enchainment of norbornene-type monomers as shown below:

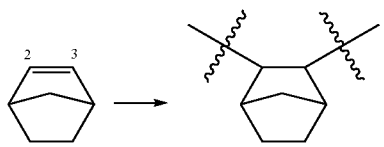

Accordingly, in accordance with the practice of this invention there is provided a composition encompassing a Component A and a Component B, wherein each of Component A and Component B comprises one or more monomers of formula (I) or formula (II) and wherein Component A further comprises a procatalyst and Component B further comprises an activator, wherein:

a) the monomer of formula (I) is:

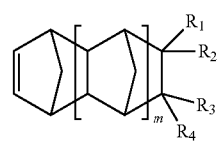

wherein:
m is an integer 0, 1 or 2;
at least one of $R_1$, $R_2$, $R_3$ and $R_4$ is a group of formula (A):

—X-Aryl                                        (A)

wherein:
X is selected from the group consisting of:
O, CO, C(O)O, OC(O), OC(O)O, S, $(CR_5R_6)_a$, $O(CR_5R_6)_a$, $(CR_5R_6)_aO$, $(CR_5R_6)_aO(SiR_5R_6)_a$, $(CR_5R_6)_aO(CR_5R_6)_a$, $C(O)(CR_5R_6)_a$, $(SiR_5R_6)_aO(SiR_5R_6)_a$, $(CR_5R_6)_aC(O)$, $C(O)O(CR_5R_6)_a$, $(CR_5R_6)_aC(O)O$, $OC(O)(CR_5R_6)_a$, $(CR_5R_6)_aOC(O)$, $(CR_5R_6)_aOC(O)O$, $(CR_5R_6)_aOC(O)O(CR_5R_6)_a$, $OC(O)O(CR_5R_6)_a$, $S(CR_5R_6)_a$, $(CR_5R_6)_aS$, $(SiR_5R_6)_a$, $O(SiR_5R_6)_a$ and $(SiR_5R_6)_aO$, where $R_5$ and $R_6$ are the same or different and each independently represents hydrogen, methyl, ethyl, linear or branched ($C_3$-$C_{12}$)alkyl and ($C_6$-$C_{10}$)aryl, and a is an integer from 0 to 12, inclusive;

Aryl is substituted or unsubstituted phenyl of formula:

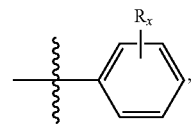

substituted or unsubstituted biphenyl of formula:

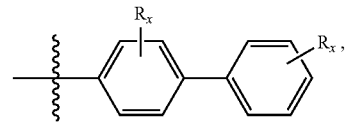

substituted or unsubstituted naphthyl of formula:

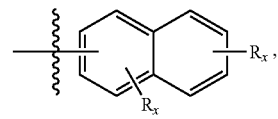

substituted or unsubstituted terphenyl of formula:

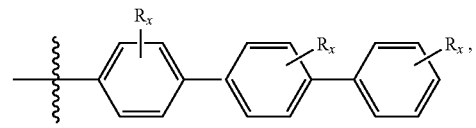

substituted or unsubstituted anthracenyl of formula:

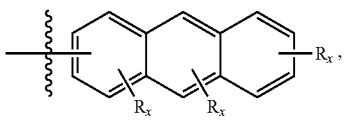

substituted or unsubstituted fluorenyl of formula:

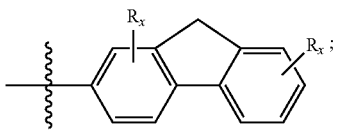

where $R_x$ in each occurrence is independently selected from methyl, ethyl, linear or branched $(C_3-C_{12})$alkyl or $(C_6-C_{10})$aryl, the remaining $R_1$, $R_2$, $R_3$ and $R_4$ are the same or different and each independently represents hydrogen, halogen, a hydrocarbyl or halohydrocarbyl group selected from the group consisting of methyl, ethyl, linear or branched $(C_3-C_{12})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl and perfluoro$(C_6-C_{10})$aryl$(C_1-C_3)$alkyl;

b) the monomer of formula (II) is:

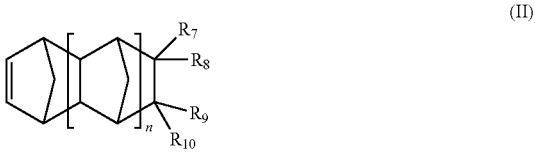

(II)

wherein:

n is an integer 0, 1 or 2;

$R_7$, $R_8$, $R_9$ and $R_{10}$ are the same or different and each independently selected from the group consisting of hydrogen, halogen, a hydrocarbyl or halohydrocarbyl group selected from methyl, ethyl, linear or branched $(C_3-C_{16})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl and a group of formula (B):

—Y-Aryl$_1$ (B)

wherein:

Y is selected from the group consisting of:

$(CR_5R_6)_a$, $O(CR_5R_6)_a$ and $(CR_5R_6)_aO$, where a, $R_5$ and $R_6$ are as defined above;

Aryl$_1$ is phenyl or phenyl substituted with one or more $(C_1-C_6)$alkyl;

and wherein said monomer of formula (I) is having a refractive index greater than or equal to 1.6 and said Component A and Component B are in a clear liquid form at room temperature.

The monomers employed in the composition of this invention are mostly known in the literature or a few of them may be novel, but can be prepared by any of the known methods in the art to make such or similar types of monomers. Some such procedures have been provided hereafter in the specific examples that follows.

In addition, the monomers as described herein readily undergo mass polymerization, i.e., in their neat form without use of any solvents by vinyl addition polymerization using transition metal catalysts, such as for example, nickel, palladium or platinum. See for example, U.S. Pat. Nos. 6,455,650; 6,825,307; and 7,910,674; pertinent portions of which are incorporated herein by reference. The term "mass polymerization" as used herein shall have the generally accepted meaning in the art. That is, a polymerization reaction that is generally carried out in the substantially absence of a solvent. In some cases, however, a small proportion of solvent is present in the reaction medium. For example, such use of small amounts of solvent may be used to dissolve the procatalyst and/or the activator or convey the same to the reaction medium. Also, some solvent may be used to reduce the viscosity of the monomer. The amount of solvent that can be used in the reaction medium may be in the range of 0 to 50 weight percent based on the total weight of the monomers employed. Any of the suitable solvents that dissolves the catalyst, activator and/or monomers can be employed in this invention. Examples of such solvents include alkanes, cycloalkane, toluene, THF, methylene chloride, dichloroethane, and the like. Generally, it is advantageous to use a solvent having a boiling point lower than the polymerization temperature, such as for example 100° C. or less; 120° C. or less; or 150° C. or less.

Advantageously, it has now been found that one or more of the monomers themselves can be used to dissolve the procatalyst as well as the activator and thus avoiding the need for the use of solvents. In addition, one monomer can itself serve as a solvent for the other monomer and thus eliminating the need for an additional solvent. For example, if a monomer of formula (I) is a solid at room temperature, then a monomer of formula (II) (or even a different monomer of formula (I)), which is liquid at room temperature can be used as a solvent for the monomer of formula (I) which is a solid or vice versa. Therefore, in such situations more than one monomer can be employed in the composition of this invention.

Accordingly, it has now been surprisingly found that monomers of formula (I) serve as high refractive index materials imparting high refractive index to the resulting polymeric film upon mass polymerization by mixing Component A and Component B together. Thus, monomers of formula (I) as used herein may be termed as "Refractive index modifiers" of the composition of this invention. In general, the monomers of formula (I) which are suitable in this invention feature a refractive index of equal to 1.6 or higher. In some embodiments the refractive index of the monomers of formula (I) is higher than 1.6. In some other embodiments the refractive index of the monomers of formula (I) is in the range from about 1.6 to 1.8. In yet some other embodiments the refractive index of the monomers of formula (I) is higher than 1.65, higher than 1.7 or higher than 1.75. In some other embodiments it may even be higher than 1.8.

Now, turning to monomer of formula (II), it is generally contemplated that monomer of formula (II), if employed, serves as a viscosity modifier. Accordingly, in general, monomer of formula (II) is a liquid at room temperature and can be used in conjunction with monomer of formula (I) which can be a solid, high viscosity liquid and/or a low viscosity liquid. Although it is also possible that in some cases monomer of formula (I) is a low viscosity liquid which can be used in combination with a high viscosity liquid of monomer of formula (II). Accordingly, all such combinations are part of this invention.

In one of the embodiments of this invention the composition of this invention encompasses only one monomer of formula (I). In some other embodiments of this invention the composition of this invention encompasses only one monomer of formula (II). Such compositions results in a film having a homopolymer of the respective monomer of formula (I) or (II).

In a further embodiment of this invention the composition of this invention encompasses at least two monomers wherein first monomer is of formula (I) and a second monomer is of formula (II). As noted, the monomer of formula (II) can exhibit a refractive index less than 1.6. In some embodiments, the refractive index of the monomers of formula (II) is less than 1.59. In some other embodiments the refractive index of the monomers of formula (II) is in the range from about 1.4 to 1.6. In yet some other embodiments the refractive index of the monomers of formula (II) is lower than 1.55, lower than 1.5 or lower than 1.45. In some other embodiments it may even be lower than 1.4. It should however be noted that two different monomers of formula (I) or two different monomers of formula (II) can also be employed. All such permissible combinations are to be considered part of this invention.

In addition, as noted, the monomer of formula (II) also generally exhibit low viscosity, which can be below 100 centipoise. In some embodiments, the viscosity of the monomers of formula (II) is less than 90 centipoise. In some other embodiments the viscosity of the monomers of formula (II) is in the range from about 40 to 100 centipoise. In yet some other embodiments the viscosity of the monomers of formula (II) is lower than 80 cP, lower than 60 cP or lower than 50 cP. In some other embodiments it may even be lower than 40 cP. In some embodiments the first monomer, e.g., monomer of formula (I) is completely miscible with the second monomer, e.g., monomer of formula (II) and forms a clear solution. Accordingly, the monomer of formula (II) serves as a "Viscosity modifier" of the composition of this invention.

When the composition of this invention contains two monomers, for example, the monomer of formula (I) and the monomer of formula (II), they can be present in any desirable amounts that would bring about the intended benefit, including either refractive index modification or viscosity modification or both. Accordingly, the molar ratio of monomer (I) to monomer (II) can be from 0:100 to 100:0. That is, only monomer of formula (I) or monomer of formula (II) can be employed in certain applications. In other words, any amount of these two monomers can be employed. In some embodiments, the molar ratio of monomer of formula (I): monomer of formula (II) is in the range from 5:95 to 95:5; in some other embodiments it is from 10:90 to 90:10; it is from 20:80 to 80:20; it is from 30:70 to 70:30; it is from 60:40 to 40:60; and it is 50:50, and so on.

Advantageously, it has further been found that the composition according to this invention forms a substantially transparent film when Component A and Component B are mixed together at a temperature from 50° C. to 150° C. That is to say, that when Component A and Component B are mixed together and heated to certain elevated temperature, the monomers undergo mass polymerization to form films which are substantially transparent to visible light. That is, most of the visible light is transmitted through the film. In some embodiments such film formed from the composition of this invention exhibits a transmission of equal to or higher than 90 percent of the visible light. In some other embodiments such film formed from the composition of this invention exhibits a transmission of equal to or higher than 95 percent of the visible light. It should be further noted that any temperature that is suitable to carry out this mass polymerization can be employed, such as for example, 50° C. to 150° C. as indicated above. However, any temperature below 50° C. or higher than 150° C. can also be employed. In some embodiments the temperature employed to 60° C., 70° C., 80° C., 90° C., 100° C., 110° C., 120° C., 130° C., 140° C. or higher than 150° C.

In general, the compositions in accordance with the present invention encompass the above described one or more of the monomer of formula (I) and if needed one or more monomer of formula (II), as it will be seen below, various composition embodiments are selected to provide properties to such embodiments that are appropriate and desirable for the use for which such embodiments are directed, thus such embodiments are tailorable to a variety of specific applications.

For example, as already discussed above, proper combination of monomers of formula (I) and monomers of formula (II) makes it possible to tailor a composition having the desirable refractive index, viscosity and optical transmission properties. In addition, it may be desirable to include other polymeric or monomeric materials which are compatible to provide desirable optical properties depending upon the end use application. Accordingly, the compositions of this invention can also include other high refractive polymeric materials which will bring about such intended benefit. Examples of such polymers include without any limitation, poly($\alpha$-methylstyrene), poly(vinyl-toluene), copolymers of $\alpha$-methylstyrene and vinyl-toluene, and the like.

Similarly, various known optically transparent inorganic materials can also be used to increase the refractive index of the compositions of this invention. Such examples include silicon based inorganic materials, including but not limited to bentonite, aluminum-magnesium silicate, aluminum silicate, magnesium silicate, calcium silicate, barium silicate, strontium silicate, montmorillonite, beidellite, nontronite, saponite, hectorite, silica, silicic anhydride, silylated silica, and the like. Other inorganic materials include but not limited to titanium dioxide, zirconium oxide, zinc oxide, cerium oxide, magnesium oxide, barium sulfate, calcium sulfate, magnesium sulfate, calcium carbonate, magnesium carbonate, talc, mica, kaolin, cerisite, white mica, synthetic mica, bronze mica, lepidolite, black mica, lithia mica, silicic acid, silicic acid anhydride, metal tungstate, hydroxyapatite, vermiculite, higilite, hectolite, zeolite, ceramics powder, dibasic calcium phosphate, alumina, aluminum hydroxide, boron nitride, and silicon nitride. Advantageously, it has now been found that such inorganic materials are present in the form of a nanoparticles so as to obtain fine dispersion of the inorganic materials into the compositions of this invention and provide optical transparency in the visible region, thus providing a homogeneously dispersed composition exhibiting uniformly high refractive index property throughout the dispersed composition of this invention. Accordingly, the average particle size distribution of such inorganic nanoparticle materials is generally less than 100 nm, less than 50 nm or less than 25 nm. In some embodiments nanoparticles of titania is uniformly dispersed throughout the film formed from the composition of this invention. Any amount of one or more of the aforementioned inorganic materials can be used in the composition of this invention so as to bring about the required change in refractive index. For example, 5 to 60 weight percent of the inorganic materials can be used. In some other embodiments 10 to 50 weight percent of the inorganic materials can be used. In yet other embodiments 20 to 40 weight percent of the inorganic materials can be used.

Advantageously, it has further been found that the compositions of this invention can also contain additional monomers. In some embodiments, the composition according to this invention may further contain one or more monomers selected from monomer of formula (III) or monomer of formula (IV).

The monomer of formula (III) is:

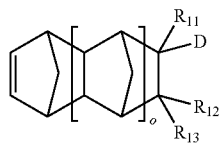
(III)

wherein:
o is an integer from 0 to 2, inclusive;
D is $SiR_{14}R_{15}R_{16}$ or a group of formula (C):

(C); wherein c is an integer from 1 to 10, inclusive, and where one or more of $CH_2$ is optionally substituted with $(C_1-C_{10})$alkyl or $(C_1-C_{10})$perfluoroalkyl;

$R_{11}$, $R_{12}$ and $R_{13}$ are the same or different and independently of each other selected from hydrogen, halogen and hydrocarbyl, where hydrocarbyl is selected from methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_2)$alkoxy, $(C_3-C_{12})$cycloalkoxy, $(C_6-C_{12})$bicycloalkoxy, $(C_7-C_4)$tricycloalkoxy, $(C_6-C_{10})$aryloxy$(C_1-C_3)$alkyl or $(C_6-C_{10})$aryloxy; and $R_{14}$, $R_{15}$ and $R_{16}$ are each independently of one another methyl, ethyl, linear or branched $(C_3-C_9)$alkyl, substituted or unsubstituted $(C_6-C_{14})$aryl, methoxy ethoxy, linear or branched $(C_3-C_9)$alkoxy or substituted or unsubstituted $(C_6-C_{14})$aryloxy.

In this aspect of the invention, it has now been found that monomers of formula (III) provides further advantages. Namely, the monomers of formula (III) depending upon the nature of the monomer may impart high or low refractive index to the composition, thus it can be tailored to meet the need. In addition, the monomers of formula (III) are generally improve the adhesion properties and thus can be used as "adhesion modifiers." Finally, the monomers of formula (III) may exhibit low viscosity and good solubility for the procatalyst and/or activator, among various advantages.

The monomer of formula (IV) is:

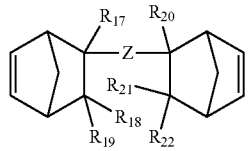
(IV)

wherein:
Z is an arylene selected from the following:

,

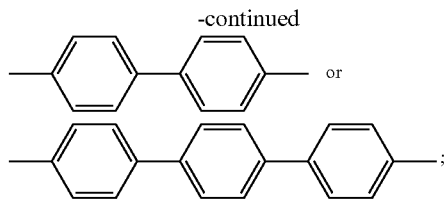

$R_{17}$, $R_{18}$, $R_{19}$, $R_{20}$, $R_{21}$ and $R_{22}$ are the same or different and independently of each other selected from hydrogen, halogen and hydrocarbyl, where hydrocarbyl is selected from methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl or $(C_6-C_{10})$-aryloxy.

The monomers of formula (IV) are bifunctional monomers expected to exhibit high refractive index. Accordingly, it is contemplated that incorporation of monomers of formula (IV) into composition of this invention generally increases the refractive index of the composition and also increase crosslinkability with other molecules. Thus, by incorporation of monomers of formula (IV) into the composition of this invention my increase compatibility with other materials depending upon the intended application thereby enhancing the properties of the composition of the invention.

Accordingly, any of the monomers within the scope of monomer of formula (I) can be employed in the composition of the invention as either Component A or Component B or in both Components A and B. Representative examples of monomer of formula (I) include the following without any limitations:

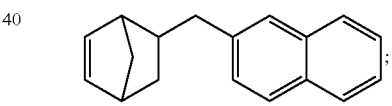

2-(bicyclo[2.2.1]hept-5-en-2-ylmethyl)naphthalene

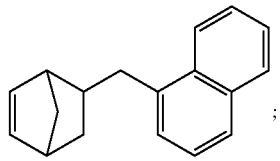

1-(bicyclo[2.2.1]hept-5-en-2-ylmethyl)naphthalene

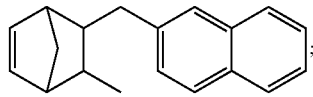

2-((3-methylbicyclo[2.2.1]hept-5-en-2-yl)methyl)naphthalene

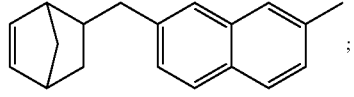

2-(bicyclo[2.2.1]hept-5-en-2-ylmethyl)-7-methylnaphthalene

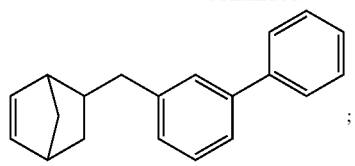

5-([1,1'-biphenyl]-3-
ylmethyl)bicyclo[2.2.1]hept-2-ene

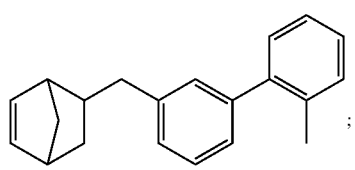

5-((2'-methyl-[1,1'-biphenyl]-3-
yl)methyl)bicyclo[2.2.1]hept-2-ene

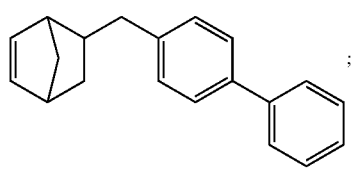

5-([1,1'-biphenyl]-4-
ylmethyl)bicyclo[2.2.1]hept-2-ene

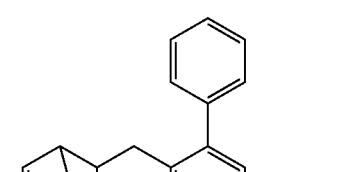

5-([1,1'-biphenyl]-2-
ylmethyl)bicyclo[2.2.1]hept-2-ene

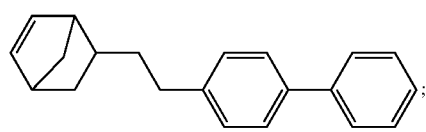

5-(2-([1,1'-biphenyl]-4-
yl)ethyl)bicyclo[2.2.1]hept-2-ene
(NBEtPhPh)

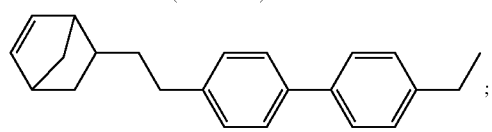

5-(2-(4'-ethyl-[1,1'-biphenyl]-4-
yl)ethyl)bicyclo[2.2.1]hept-2-ene

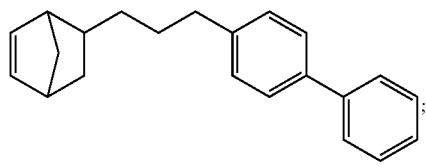

5-(3-([1,1'-biphenyl]-4-
yl)propyl)bicyclo[2.2.1]hept-2-ene;

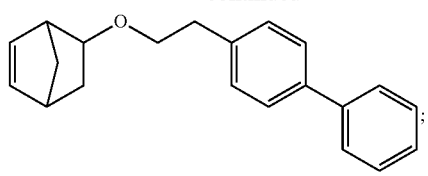

5-(2-([1,1'-biphenyl]-4-
yl)ethoxy)bicyclo[2.2.1]hept-2-ene

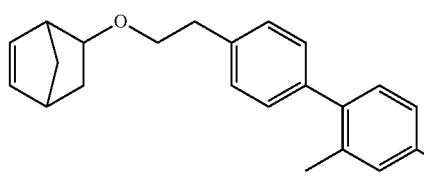

5-(2-(2',4'-dimethyl-[1,1'-biphenyl]-4-
yl)ethoxy)bicyclo[2.2.1]hept-2-ene

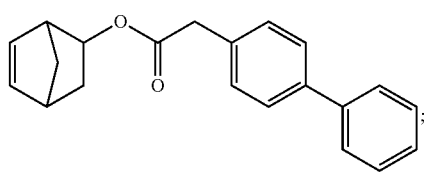

bicyclo[2.2.1]hept-5-en-2-yl
2-([1,1'-biphenyl]-4-yl)acetate

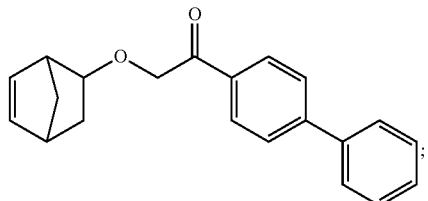

bicyclo[2.2.1]hept-5-en-2-ylmethyl
[1,1'-biphenyl]-4-carboxylate

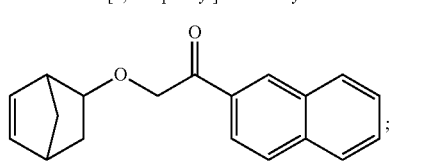

bicyclo[2.2.1]hept-5-en-2-ylmethyl 2-naphthoate

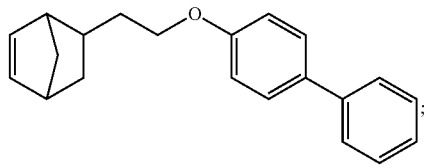

5-(2-([1,1'-biphenyl]-4-
yloxy)ethyl)bicyclo[2.2.1]hept-2-ene

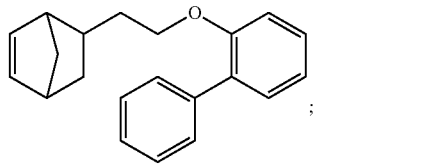

5-(2-([1,1'-biphenyl]-2-
yloxy)ethyl)bicyclo[2.2.1]hept-2-ene
(NBEtO-2-PhPh

-continued

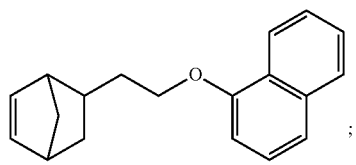

1-(2-(bicyclo[2.2.1]hept-5-en-
2-yl)ethoxy)naphthalene
(NBEtO-1-naphthyl)

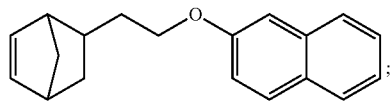

2-(2-(bicyclo[2.2.1]hept-5-en-
2-yl)ethoxy)naphthalene
(NBEtO-2-naphthyl)

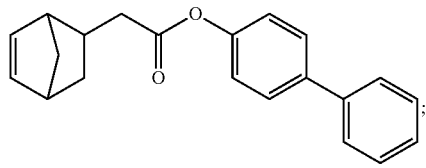

[1,1'-biphenyl]-4-yl 2-
(bicyclo[2.2.1]hept-5-en-2-yl)acetate

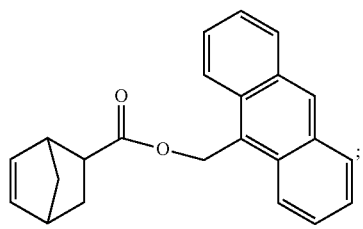

anthracen-9-ylmethyl
bicyclo[2.2.1]hept-5-ene-2-carboxylate

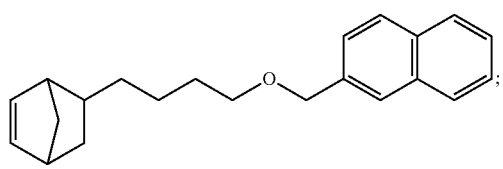

2-((4-(bicyclo[2.2.1]hept-5-en-2-yl)butoxy)methyl)naphthalene

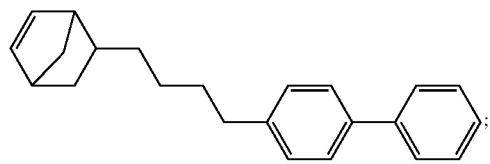

5-(4-([1,1'-biphenyl]-4-yl)butyl)bicyclo[2.2.1]hept-2-ene

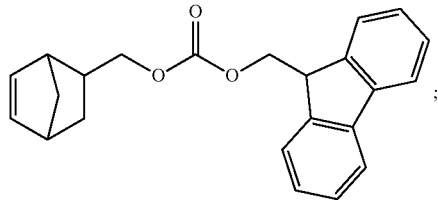

(9H-flouren-9-yl)methyl
(bicyclo[2.2.1]hept-5-en-2-ylmethyl) carbonate

-continued

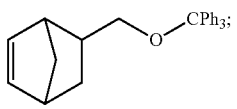

5-((trityloxy)methyl)bicyclo[2.2.1]hept-2-ene
(NBMeOCPh₃)

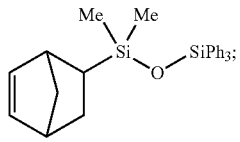

1-(bicyclo[2.2.1]hept-5-en-2-yl)-1,1-
dimethyl-3,3,3-triphenyldisiloxane
(NBSi(CH₃)₂OSiPh₃)

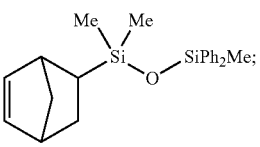

1-(bicyclo[2.2.1]hept-5-en-2-yl)-1,1,3-
trimethyl-3,3-diphenyldisiloxane
(NBSi(CH₃)₂OSiPh₂CH₃)

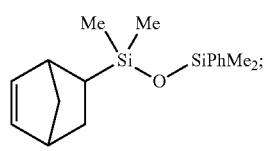

1-(bicyclo[2.2.1]hept-5-en-2-yl)-1,1,3,3-
tetramethyl-3-phenyldisiloxane

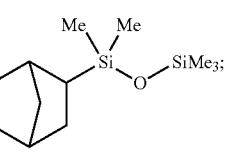

1-(bicyclo[2.2.1]hept-5-en-2-yl)-
1,1,3,3,3-pentamethyldisiloxane

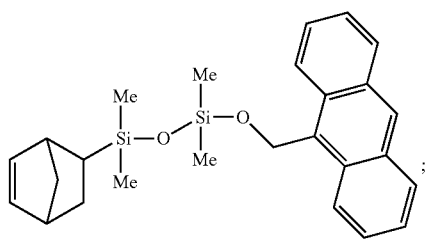

1-(anthracen-9-ylmethoxy)-3-(bicyclo[2.2.1]hept-5-
en-2-yl)-1,1,3,3,-tetramethyldisiloxane

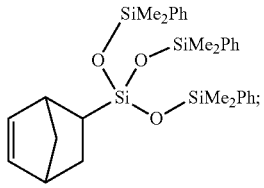

3-(bicyclo[2.2.1]hept-5-en-2-yl)-3-
((dimethyl(phenyl)silyl)oxy)-
1,1,5,5-tetramethyl-1,5-diphenyltrisiloxane

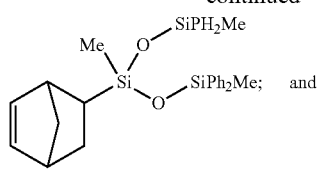

3-(bicyclo[2.2.1]hept-5-en-2-yl)-
1,3,5-trimethyl-1,1,5,5-
tetraphenyltrisiloxane

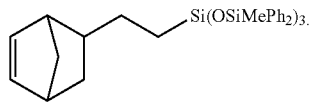

3-(2-(bicyclo[2.2.1]hept-5-en-2-yl)ethyl)-
1,5-dimethyl-3-((methyldiphenylsilyl)oxy)-
1,1,5,5-tetraphenylsiloxane Turning now to specific monomers of formula (II) that can be employed to form the composition of this invention it is contemplated that any monomer of formula (II) can be employed. Exemplary monomers of such type include but not limited to those selected from the group consisting of:

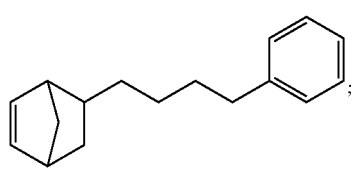

5-(4-phenylbutyl)bicyclo[2.2.1]hept-2-ene

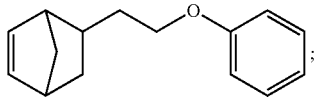

5-(2-phenoxyethyl)bicyclo[2.2.1]hept-2-ene

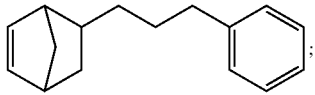

5-(3-phenylpropyl)bicyclo[2.2.1]hept-2-ene

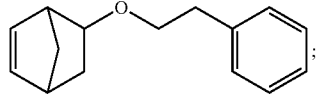

5-phenethoxybicyclo[2.2.1]hept-2-ene

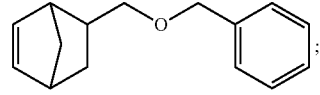

5-((benzyloxy)methyl)bicyclo[2.2.1]hept-
2-ene

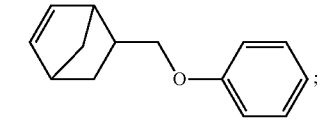

5-(phenoxymethyl)bicyclo[2.2.1]hept-2-ene

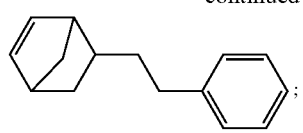

5-phenethylbicyclo[2.2.1]hept-2-ene
(PENB)

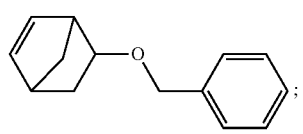

5-(benzyloxy)bicyclo[2.2.1]hept-2-ene

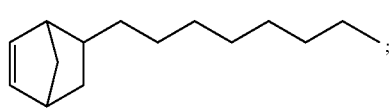

5-octylbicyclo[2.2.1]hept-2-ene
(OctNB)

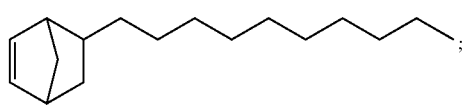

5-decylbicyclo[2.2.1]hept-2-ene
(DecNB)

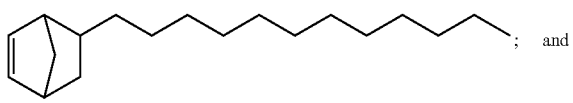

; and 5-dodecylbicyclo[2.2.1]hept-2-ene
(DoDecNB)

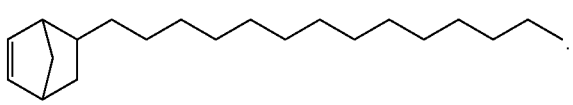

5-tetradecylbicyclo[2.2.1]hept-2-ene
(TetraDecNB)

Turning now to monomer of formula (III) to form the composition of this invention it is contemplated that any monomer within the scope of monomer of formula (III) can be employed. Exemplary monomers of such type include but not limited to those selected from the group consisting of:

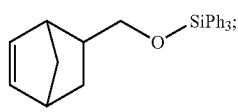

(bicyclo[2.2.1]hept-5-en-2-
ylmethoxy)triphenylsilane
(NBMeOSiPh3)

-continued

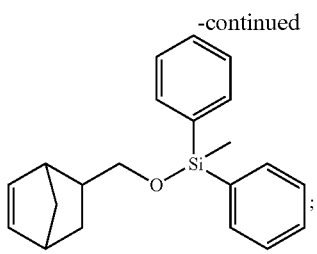

(bicyclo[2.2.1]hept-5-en-2-ylmethoxy)(methyl)diphenylsilane (NBCH₂OSiMePh₂)

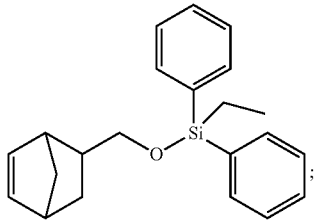

(bicyclo[2.2.1]hept-5-en-2-ylmethoxy)(ethyl)diphenylsilane

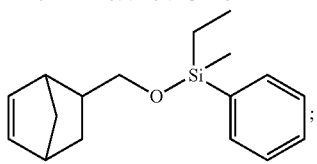

(bicyclo[2.2.1]hept-5-en-2-ylmethoxy)(ethyl)(methyl)(phenyl)silane

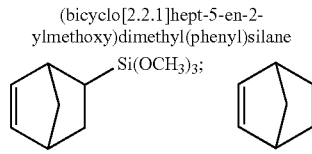

(bicyclo[2.2.1]hept-5-en-2-ylmethoxy)dimethyl(phenyl)silane

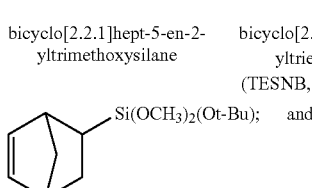

bicyclo[2.2.1]hept-5-en-2-yltrimethoxysilane bicyclo[2.2.1]hept-5-en-2-yltriethoxysilane (TESNB, NBSi(OC₂H₅)₃)

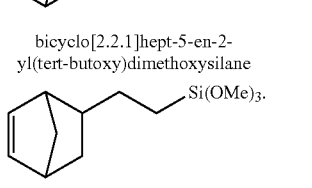

bicyclo[2.2.1]hept-5-en-2-yl(tert-butoxy)dimethoxysilane and (2-(bicyclo[2.2.1]hept-5-en-2-yl)ethyl)trimethoxysilane Turning now to monomer of formula (IV) to form the composition of this invention it is contemplated that any monomer within the scope of monomer of formula (IV) can be employed. Exemplary monomers of such type include but not limited to those selected from the group consisting of:

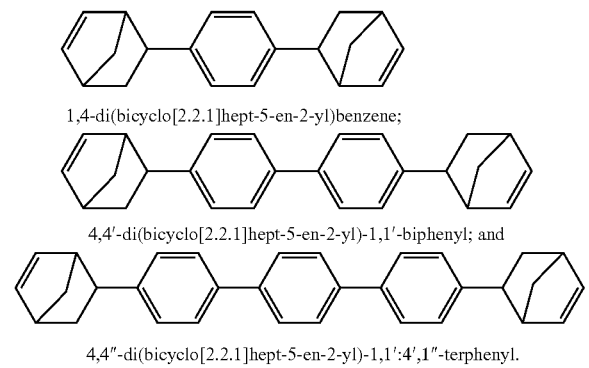

1,4-di(bicyclo[2.2.1]hept-5-en-2-yl)benzene;

4,4'-di(bicyclo[2.2.1]hept-5-en-2-yl)-1,1'-biphenyl; and 4,4''-di(bicyclo[2.2.1]hept-5-en-2-yl)-1,1':4',1''-terphenyl.

In a further embodiment, the composition of this invention encompasses one or more monomers of formula (I) and at least one monomer of formula (II).

In another embodiment, the composition of this invention encompasses one or more monomers of formula (II) and at least one monomer of formula (III) and optionally one monomer of formula (I) and one monomer of formula (IV).

In yet a further embodiment, the composition of this invention encompasses one monomer of formula (I), one or more monomers of formula (II) and at least one monomer of formula (III), and optionally one monomer of formula (IV).

In a further embodiment of this invention, the composition contains any of the procatalyst that would bring about the mass polymerization as described herein. Generally, such suitable procatalysts include a number of known neutral salts of transition metals, such as palladium or platinum, among others. Exemplary procatalysts without any limitation maybe selected from the group consisting of:

palladium (II) bis(triphenylphosphine) dichloride;
palladium (II) bis(triphenylphosphine) dibromide;
palladium (II) bis(triphenylphosphine) diacetate;
palladium (II) bis(triphenylphosphine) bis(trifluoroacetate);
palladium (II) bis(triisopropylphosphine) dichloride;
palladium (II) bis(triisopropylphosphine) dibromide;
palladium (II) bis(triisopropylphosphine) diacetate;
palladium (II) bis(triisopropylphosphine) bis(trifluoroacetate);
palladium (II) bis(tricyclohexylphosphine) dichloride;
palladium (II) bis(tricyclohexylphosphine) dibromide;
palladium (II) bis(tricyclohexylphosphine) diacetate;
palladium (II) bis(tricyclohexylphosphine) bis(trifluoroacetate);
palladium (II) bis(tri-p-tolylphosphine) dichloride;
palladium (II) bis(tri-p-tolylphosphine) dibromide;
palladium (II) bis(tri-p-tolylphosphine) diacetate;
palladium (II) bis(tri-p-tolylphosphine) bis(trifluoroacetate);
palladium (II) ethyl hexanoate;
dichloro bis(acetonato)palladium (II);
dichloro bis(benzonitrile)palladium (II);
platinum (II) chloride;
platinum (II) bromide; and
platinum bis(triphenylphosphine)dichloride.

As noted, the composition of this invention contains an activator which when combined with the procatalyst will cause mass polymerization of the monomers contained therein at a desirable temperature as described herein. Any of the known activators can be employed for this purpose. Exemplary activators without any limitation maybe selected from the group consisting of:

lithium tetrafluoroborate;
lithium triflate;
lithium tetrakis(pentafluorophenyl)borate;
lithium tetrakis(pentafluorophenyl)borate etherate;
lithium tetrakis(pentafluorophenyl)borate isopropanolate;
lithium tetraphenylborate;
lithium tetrakis(3,5-bis(trifluoromethyl)phenyl)borate;
lithium tetrakis(2-fluorophenyl)borate;
lithium tetrakis(3-fluorophenyl)borate;
lithium tetrakis(4-fluorophenyl)borate;
lithium tetrakis(3,5-difluorophenyl)borate;
lithium hexafluorophosphate;
lithium hexaphenylphosphate;
lithium hexakis(pentafluorophenyl)phosphate;
lithium hexafluoroarsenate;
lithium hexaphenylarsenate;
lithium hexakis(pentafluorophenyl)arsenate;
lithium hexakis(3,5-bis(trifluoromethyl)phenyl)arsenate;
lithium hexafluoroantimonate;
lithium hexaphenylantimonate;
lithium hexakis(pentafluorophenyl)antimonate;
lithium hexakis(3,5-bis(trifluoromethyl)phenyl)antimonate;
lithium tetrakis(pentafluorophenyl)aluminate;
lithium tris(nonafluorobiphenyl)fluoroaluminate;
lithium (octyloxy)tris(pentafluorophenyl)aluminate;
lithium tetrakis(3,5-bis(trifluoromethyl)phenyl)aluminate;
lithium methyltris(pentafluorophenyl)aluminate; and
dimethylanilinium tetrakis(pentafluorophenyl)borate.

In another embodiment of this invention, the composition of this invention contains in each of the Component A and Component B 5-(2-([1,1'-biphenyl]-4-ylethyl)bicyclo[2.2.1]hept-2-ene (NBEtPhPh), 5-phenethylbicyclo[2.2.1]hept-2-ene (PENB) and (bicyclo[2.2.1]hept-5-en-2-ylmethoxy)(methyl)diphenylsilane (NBCH$_2$OSiMePh$_2$). The Component A further contains palladium (II) bis(tricyclohexyl-phosphine) diacetate as procatalyst and Component B contains lithium tetrakis(pentafluorophenyl)borate etherate as an activator.

In a further aspect of this invention there is provided a kit for forming a substantially transparent film. There is dispensed in this kit two components designated as a Component A and a Component B. In each of these Component A and Component B there is dispensed one or more monomers of formula (I), formula (II), formula (III) or formula (IV) and wherein Component A further comprises a procatalyst and Component B further comprises an activator. The monomers of formula (I) to formula (IV) are the ones as described hereinabove.

Generally, the Component A and Component B of the aforementioned kit can encompass one or more monomers of formula (I), one or more monomers of formula (II), one or more monomers of formula (III) and one or more monomers of formula (IV). In some embodiments the kit of this invention encompasses Component A and Component B containing at least two monomers wherein first monomer is of formula (I) and second monomer is of formula (II). Any of the monomers of formula (I) or (II) as described herein can be used in this embodiment. The molar ratio of monomers of formula (I) and formula (II) contained in these components can vary and may range from 1:99 to 99:1, or 10:90 to 90:10, 20:80 to 80:20, 30:70 to 70:30, 60:40 to 40:60 or 50:50, and so on. In some embodiments the kit may encompass Component A and Component B wherein dispensed only one monomer which could be monomer of formula (I), monomer of formula (II), monomer of formula (III) or monomer of formula (IV). Further, the monomers of formulae (I) to (IV) are completely miscible with each other to form a clear solution at room temperature. In the alternative, two or more monomers of formulae (I) to (IV) can be mixed together with a solvent to form a clear solution as described herein. In some embodiments the monomer mixture may become a clear solution at slightly elevated temperature, such as for example, 30° C. or 40° C. or 50° C., or at higher than 50° C., before they undergo mass polymerization. In another aspect of this embodiment of this invention the Component A and Component B are mixed together at a temperature of from 50° C. to 100° C. for a sufficient length of time to form a polymeric film. That is to say, that the Component A and Component B are mixed and poured onto a surface or onto a substrate which needs to be encapsulated, and heated to a temperature of 50° C. to 100° C. in order for the monomers to undergo polymerization to form a solid transparent polymer which could be in the form of a transparent film. Generally, as already noted above, such polymerization can take place at 50° C., 60° C., 70° C., 80° C., 90° C., 100° C. or higher. The heating can also be carried out in stages to trigger the polymerization, for example to 60° C. for 5 minutes, and then heating to 70° C. for 15 minutes and so on. By practice of this invention it is now possible to obtain polymeric films on such substrates which are substantially transparent film. The "substantially transparent film" as used herein means that the films formed from the composition of this invention are optically clear in the visible light. Accordingly, in some embodiments of this invention such films are having at least 90 percent of visible light transmission, in some other embodiments the films formed from the composition of this invention exhibit at least 95 percent of visible light transmission.

In some embodiments of this invention the kit as described herein encompasses Component A and Component B which further contain one or more monomers selected from monomer of formula (III) or monomer of formula (IV) as described hereinabove. Again, any of the monomers of formula (III) or (IV) as described herein can be used in this embodiment, and in any desirable amounts depending on the nature of the intended use.

In some embodiments, the kit as described herein encompasses Component A and Component B, each of which contains 5-(2-([1,1'-biphenyl]-4-yl)ethyl)bicyclo[2.2.1]hept-2-ene (NBEtPhPh), 5-phenethylbicyclo[2.2.1]hept-2-ene (PENB) and (bicyclo[2.2.1]hept-5-en-2-ylmethoxy)(methyl)diphenylsilane (NBCH$_2$OSiMePh$_2$); and wherein Component A further contains palladium (II) bis(tricyclohexyl-phosphine) diacetate and Component B contains lithium tetrakis(pentafluorophenyl)borate etherate.

In another aspect of this invention there is further provided a composition comprising a Component A and a Component B, wherein each of the Component A and the Component B comprises one or more monomers of formula (I) or formula (II) and wherein the Component A further comprises a procatalyst and the Component B further comprises an activator. Any of the monomers of formula (I) or formula (II) as described hereinabove can be used in this aspect of the invention. The monomer of formula (I) is having a refractive index greater than or equal to 1.6. The monomer of formula (II) is having a refractive index less than 1.6 and viscosity below 100 centipoise. The monomer of formula (I) is completely miscible with said second monomer of formula (II) and forms a clear solution. When the Component A and the Component B are mixed together and exposed to a temperature in the range of from 50° C. to 100° C. forms a substantially transparent film having a transmission higher than 90 percent of the visible light.

In yet another aspect of this invention there is further provided a method of forming a substantially transparent film for the fabrication of a variety of optoelectronic device comprising:

forming a Component A and a Component B, wherein each of the Component A and the Component B comprises one or more monomers of formula (I) or formula (II) and wherein the Component A further comprises a procatalyst and the Component B further comprises an activator;

mixing the Component A and the Component B together to form a homogeneous mixture;

coating a suitable substrate with the above mixture or pouring the above mixture onto a suitable substrate to form a film; and heating the film to a suitable temperature to cause polymerization of the monomers.

The coating of the desired substrate to form a film with the mixture of Component A and Component B of this invention can be performed by any of the coating procedures as described herein and/or known to one skilled in the art, such as by spin coating. Other suitable coating methods include without any limitation spraying, doctor blading, meniscus coating, ink jet coating and slot coating. The mixture can also be poured onto a substrate to form a film. Suitable substrate includes any appropriate substrate as is, or may be used for electrical, electronic or optoelectronic devices, for example, a semiconductor substrate, a ceramic substrate, a glass substrate.

Next, the coated substrate is baked, i.e., heated to facilitate the mass polymerization, for example to a temperature from 50° C. to 100° C. for from about 1 to 30 minutes, although other appropriate temperatures and times can be used. In some embodiments the substrate is baked at a temperature of from about 60° C. to about 90° C. for 2 minutes to 10 minutes.

The films thus formed are then evaluated for their optical properties using any of the methods known in the art. For example, the refractive index of the film across the visible spectrum can be measured by ellipsometry. The optical quality of the film can be determined by visual observation. Quantitatively the percent transparency can be measured by visible spectroscopy. Generally, the films formed according to this invention exhibit excellent optical transparent properties and can be tailored to desirable refractive index as described herein.

Accordingly, in some of the embodiments of this invention there is also provided a optically transparent film obtained by the mass polymerization of the composition as described herein. In another embodiment there is also provided an optoelectronic device comprising the transparent film of this invention as described herein.

The following examples are detailed descriptions of methods of preparation and use of certain compounds/monomers, polymers and compositions of the present invention. The detailed preparations fall within the scope of, and serve to exemplify, the more generally described methods of preparation set forth above. The examples are presented for illustrative purposes only, and are not intended as a restriction on the scope of the invention. As used in the examples and throughout the specification the ratio of monomer to catalyst is based on a mole to mole basis.

EXAMPLES

The following abbreviations have been used hereinbefore and hereafter in describing some of the compounds, instruments and/or methods employed to illustrate certain of the embodiments of this invention:

NBEtPhPh-5-(2-([1,1'-biphenyl]-4-yl)ethyl)bicyclo[2.2.1]hept-2-ene;
PENB-5-phenethylbicyclo[2.2.1]hept-2-ene;
DecNB-5-decylbicyclo[2.2.1]hept-2-ene;
NBCH$_2$OSiMePh$_2$-(bicyclo[2.2.1]hept-5-en-2-ylmethoxy)(methyl)diphenylsilane;
NBSi(OC$_2$H$_5$)$_3$-norbornene triethoxysilane;
NBMeOSiPh$_3$-(bicyclo[2.2.1]hept-5-en-2-ylmethoxy)triphenylsilane;
NBSi(CH$_3$)$_2$OSiPh$_3$-1-(bicyclo[2.2.1]hept-5-en-2-yl)-1,1-dimethyl-3,3,3-triphenyldisiloxane;
NBSi(CH$_3$)$_2$OSiPh$_2$CH$_3$-1-(bicyclo[2.2.1]hept-5-en-2-yl)-1,1,3-trimethyl-3,3-diphenyldi-siloxane;
NBMeOCPh$_3$-5-(((trityloxy)methyl)bicyclo[2.2.1]hept-2-ene;
NBEtO-1-Naphthyl-1-(2-(bicyclo[2.2.1]hept-5-en-2-yl)ethoxy)naphthalene;
NBEtO-2-Naphthyl-2-(2-(bicyclo[2.2.1]hept-5-en-2-yl)ethoxy)naphthalene;
NBEtO-2-PhPh-5-(2-([1,1'-biphenyl]-2-yloxy)ethyl)bicyclo[2.2.1]hept-2-ene;
NiARF-bis-(pentafluorophenyl)nickel toluene complex [($\eta^6$-toluene)Ni(C$_6$F$_5$)$_2$];
Pd-785-palladium bis(tricyclohexylphosphine)diacetate;
LiFABA-lithium tetrakis(pentafluorophenyl)borate etherate;
THF-tetrahydrofuran;
MTBE—methyl t-butyl ether; EtOAc—ethyl acetate; GPC—gel permeation chromatography;
M$_w$—weight average molecular weight; PDI—polydispersity index; cP—centipoise.

The following Examples 1 to 2E illustrate the preparation of a few of the monomers as described herein. Similar procedures can be used to prepare various other monomers within the scope of formulae (I) to (IV).

Example 1

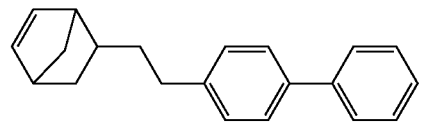

NBEtPhPh

Synthesis of PhPhMgBr

Magnesium (35.5 g, 1.46 mol) was placed inside a suitable reaction vessel equipped with a large stirbar, thermowell, condenser with valved gas inlet adapter and two appropriately sized addition funnels capped with septa. The vessel was heated to 193° C. while under a nitrogen purge. The magnesium was stirred. The vessel was cooled to 14° C. Five hundred mL anhydrous THF was transferred via cannula and vacuum into one addition funnel. 4-Bromobiphenyl (BrPhPh, 336.24 g, 1.44 mol) was dissolved under nitrogen in a septa-capped 1 L flask with 500 mL anhydrous THF. The mixture was sonicated and gave ~750 mL solution. This was transferred by cannula and vacuum into the other addition funnel. The BrPhPh/THF solution was added dropwise to the Mg. After 7 minutes, the temperature rose from 14° C. to 27° C., but the mixture was starting to reflux. The liquid level had not reached the tip of the thermowell. Five hundred mL of THF was added quickly. The temperature rose to 59° C. after another ten minutes. When the temperature dropped to 53° C., the addition rate of the BrPhPh/THF solution was increased. Addition of BrPhPh solution was completed after 2.25 h with the temperature reaching a maximum of 64° C. The reaction was heated at 60° C. for 5 h and the title compound was formed as a solution.

Synthesis of NBEtPhPh

CuI (4.88 g, 0.026 mol) was placed inside a suitable reaction vessel fitted with a mechanical stirrer, addition funnel capped with septa, thermowell, and condenser with valved gas inlet adapter. The vessel was heated to 183° C. while stirring under nitrogen purge. The CuI turned yellow. The vessel was cooled to ~50° C. The CuI turned white. Five hundred ml anhydrous THF was transferred into the vessel. NBEtBr (226.5 g, 1.325 mol) was added via cannula and vacuum into the flask. The resulting mixture was stirred as PhPhMgBr was transferred via cannula and vacuum to the addition funnel and subsequently into NBEtBr/CuI/THF mixture. The resulting gray-green solution was heated to reflux at 67° C. overnight (19.7 h).

The reaction was cooled to 4° C. Five hundred mL of saturated aqueous $NH_4Cl$ was added, causing the temperature to rise to 26° C. Another 500 ml saturated aqueous $NH_4Cl$ was added. The mixture was stirred vigorously to thoroughly mix all solids. The mixture was filtered. The flask and filter cake were rinsed with 250 mL MTBE. The blue aqueous phase was separated from the green organic phase. The aqueous phase was extracted with 3×500 mL MTBE. The MTBE extracts were combined with the green organic phase. The combined mixture was washed with 4×500 mL brine to bring the pH to 7 from 10 and until the brine wash was no longer blue. The organic phase was dried over sodium sulfate, filtered, and rotary evaporated to 358.2 g (99% yield). The material was transferred to a one liter flask and distilled in the Kugelrohr still. Several fractions were collected at a temperature range between 160 and 173° C. at 0.73 to 0.83 Torr. The fractions were combined to give 208.7 g (56% yield) of a 96.9-98.9% (GC assay) pure material. $^1H$ NMR ($CDCl_3$): δ 7.20-7.65 (aromatic resonances), 6.00-6.21 (olefinic resonances), 0.06-2.90 (aliphatic resonances). Based on the olefinic resonances, the ratio of the endo and exo isomers is 81:19.

Example 2

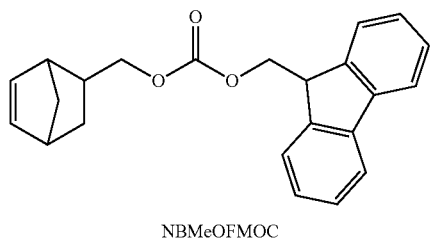 [SMILES: O=C(OCC1c2ccccc2-c2ccccc21)OCC1CC2C=CC1C2]

NBMeOFMOC

A 500 mL reactor equipped with a septum and a magnetic stirbar was charged with a solution of 9-fluorenylmethoxycarbonyl chloride (50 g, 193.8 mmol, 1 eq) in THF (250 mL). The reactor was sealed and vented with three 16G needles and placed in a water bath at room temperature. To this stirred solution was added 5-norbornene-2-methanol (24.6 g, 198.6 mmol, 1.03 eq) along with pyridine (15.7 g, 198.6 mmol, 1.03 eq) simultaneously over 20 minutes. After addition the reaction mixture was allowed to stir at room temperature for 4 days.

The reaction mixture became a slurry with white solid and a light yellow reaction liquid. The reaction mixture was filtered through a coarse glass frit and the solids were washed with THF (100 mL). The organics were removed by rotary evaporation to dryness resulting in a light yellow solid.

The crude solid was dissolved in a solvent mixture of EtOAc (150 mL) and THF (25 mL), and mixed until it became a solution. Silica gel (40 g) was added to the solution until it turned slightly opaque. This suspension was dried by rotary evaporation. A column (8 cm×40 cm) was packed with silica gel using hexanes. The dried solid was added to the column and layered with sand. The product was eluted with 10% EtOAc/hexanes initially and finished with a 30% EtOAc/hexanes mixture. Thirty-two fractions were collected. Fractions 3-20 were combined and concentrated to obtain 56.4 g (84% yield) of pure title compound as a white solid.

$^1H$ NMR (tetrachloroethane-$d_2$, 500 MHz): 8.05-7.27 (8H, m), 6.29-5.98 (2H, m), 4.71-4.49 (2H, m), 4.48-3.69 (3H, m), 3.15-2.75 (2H, m), 2.59-2.45 (1H, m), 2.03-1.81 (1H, m), 1.59-1.21 (2H, m), 0.69-0.51 (1H, m). $^{13}C$ NMR (tetrachloroethane-$d_2$): 31.7, 40.7, 45.1, 46.5, 49.7, 52.3, 72.2, 74.5, 123.1 (2C), 128 (2C), 130.1 (2C), 130.9 (2C), 135.0, 140.7, 144 (2C), 146.2 (2C), 157.9.

Example 2A

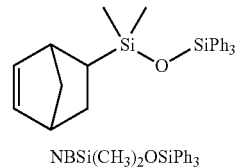

$NBSi(CH_3)_2OSiPh_3$

Into a 500 mL reactor purged with dry nitrogen and equipped with septum, dropping funnel, thermocouple and a magnetic stirbar was charged with a solution of 5-(ethoxydimethylsilyl)bicyclo[2.2.1]hept-2-ene (27.1 g, 138.4 mmol) in 100 mL of toluene. The reactor was sealed and vented with three 16G needles and placed in a water bath at room temperature. To this stirred solution was added a solution of triphenylsilane (30 g, 115.3 mmol) and tris(pentafluorophenyl)borane (2.9 g, 5.7 mmol) in 100 mL of toluene using a dropping funnel while maintaining the reaction temperature at room temperature. The reaction mixture was then allowed to stir at room temperature for an additional period of 5 hrs. After which time the reaction mixture was poured onto 15 g of neutral alumina and stirred at room temperature for 10 min to allow alumina to be dispersed into the reaction mixture and then filtered using silica (top)/celite (bottom) plug. The filtrate was rotary evaporated to remove solvent and unreacted starting materials to obtain a clear colorless oil, 45.8 g (93% yield).

$^1H$ NMR (toluene-$d_8$, 500 MHz): 7.74 (6H, m), 7.23 (9H, m), 6.08-5.95 (2H, m), 2.90-2.75 (2H, m), 1.76-0.19 (5H, m), 0.19-0.08 (6H, m). Refractive index at 585 nm: 1.58 at 20° C.

Example 2B

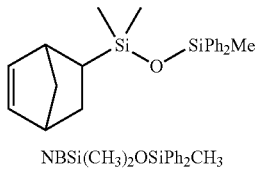

NBSi(CH3)2OSiPh2CH3

The procedures of Example 2A were substantially repeated in this Example 2B except for employing diphenylmethylsilane in place of triphenylsilane to obtain the title compound (89% yield).

$^1$H NMR (toluene-$_8$, 500 MHz): 7.65-7.62 (4H, m), 7.24-7.21 (6H, m), 5.90-5.87 (2H, m), 2.9-2.77 (2H, m), 1.75-1.01 (4.5H, m), 0.64-0.62 (3H, s), 0.14 (0.5H, m), 0.09-0.05 (6H, m). Refractive index at 585 nm: 1.54 at 20° C.

Example 2C

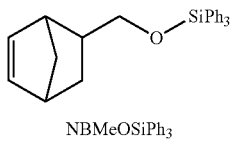

NBMeOSiPh3

The procedures of Example 2A were substantially repeated in this Example 2C except for employing 5-norbornene-2-methanol in place of 5-(ethoxydimethylsilyl)bicyclo[2.2.1]hept-2-ene to obtain the title compound (82% yield).

$^1$H NMR (toluene-d$_8$, 500 MHz): 7.76 (6H, s), 7.23 (9H, s), 6.06-5.74 (2H, m), 3.94-3.68 (2H, m), 3.06-2.88 (1H, m), 2.61-2.42 (2H, m), 1.83-0.97 (3H, m), 0.43-0.36 (1H, m).

Example 2D

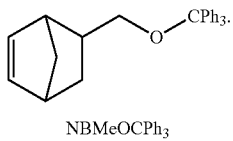

NBMeOCPh3

Into a 300 mL reactor purged with dry nitrogen and equipped with septum, thermocouple and a magnetic stirbar was charged with a solution of bicyclo[2.2.1]hept-5-en-2-ylmethanol (13.4 g, 115.3 mmol) in 130 mL of dry pyridine. The reactor was sealed and vented with three 16G needles and placed in a water bath at room temperature. To this stirred solution was added trityl chloride (20 g, 77 mmol) while maintaining the reaction temperature at room temperature. The reaction mixture was then heated to 70° C. and allowed to stir overnight. At which time the reaction mixture turned into a slurry with white solid and light yellow solution. The reaction mixture was then filtered through a coarse glass frit and the solids were washed with toluene (50 mL). The filtrate was rotary evaporated to dryness to obtain a pale yellow solid, which was washed thrice with acetone and dried under vacuum, to obtain the title compound as a white solid, 25.2 g (96% yield).

$^1$H NMR (toluene-d$_8$, 500 MHz): 7.53-7.5 (6H, m), 7.11-6.96 (9H, m), 5.81-5.71 (2H, m), 3.09-2.38 (5H, m), 1.61-0.25 (4H, m).

Example 2E

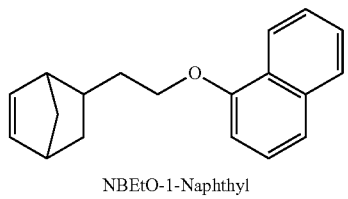 [SMILES: C1=CC2CC1CC2CCOc1cccc2ccccc12]

NBEtO-1-Naphthyl

Into a 2000 mL reactor purged with dry nitrogen and equipped with a magnetic stirbar was charged with a solution of 5-(2-bromoethyl)-2-norbornene (52.4 g, 0.26 mol), 1-naphthol (25.1 g, 0.17 mol), and cesium carbonate (85.3 g, 0.26 mol) in acetonitrile (1,000 mL). The reaction mixture was heated to 82° C. After 15 minutes of heating at this temperature, disappearance of 1-naphthol was confirmed by GC analysis.

The solvent was stripped from the reaction mixture. Methyl tert-butyl ether (100 mL) was added to the crude product, and the solution was washed with water (100 mL) twice. After evaporation of solvent, 56.5 grams of title compound was recovered as yellow colored liquid. The liquid product was treated with alumina twice and activated charcoal once with n-heptane to remove the color, and then filtered through 0.45 micron syringe filter to obtain the pure title compound, 32 grams (69% yield).

$^1$H-NMR (CDCl$_3$, 500 MHz): 8.25-8.4 (1H, m), 7.75-7.82 (1H, m), 7.6-7.3 (4H, m), 6.75-6.85 (1H, m), 6.25-6 (2H, m), 4.3-4.05 (2H, m), 2.8-2.95 (1.75H, m), 2.75 (0.25H, s), 2.4-2.3 (0.75H, m), 2.1-1.9 (1.5H, m), 1.85-1.65 (1.75H, m), 1.45-1.2 (2.25H, m), 0.75-0.65 (0.75H, m). Viscosity: 162 cPs at 25° C.; density; 1.07 at 25° C.; Refractive index: 1.59 at 20° C.

Example 2F

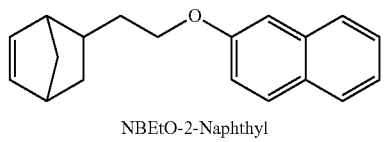 [SMILES: C1=CC2CC1CC2CCOc1ccc2ccccc2c1]

NBEtO-2-Naphthyl

The procedures of Example 2E were substantially repeated in this Example 2F except for employing 2-naphthol in place of 1-naphthol to obtain the title compound as a crystalline solid (36% yield).

$^1$H-NMR (CDCl$_3$, 500 MHz): 7.82-7.72 (3H, m), 7.5-7.4 (1H, m), 7.38-7.3 (1H, m), 7.2-7.12 (2H, m), 6.25-6 (2H, m), 4.25-4.05 (2H, m), 2.80-2.92 (1.75H, m), 2.68 (0.25H, s), 2.35-2.25 (0.75H, m), 2.1-1.9 (1.25H, m), 1.75-1.6 (2H, m), 1.48-1.4 (1.25H, m), 1.2-1.32 (1H, m), 0.7-0.62 (0.75H, m). Melting point: 56° C. (DSC)

Example 2G

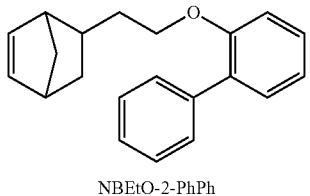 [SMILES: C1=CC2CC1CC2CCOc1ccccc1-c1ccccc1]

NBEtO-2-PhPh

The procedures of Example 2E were substantially repeated in this Example 2G except for employing 2-phenylphenol in place of 1-naphthol to obtain the title compound (91% yield).

$^1$H-NMR (CDCl$_3$, 500 MHz): 7.75-7.68 (2H, m), 7.58-7.39 (5H, m), 7.18-7.05 (2H, m), 6.28-5.97 (2H, m), 4.2-4.02 (2H, m), 2.95-2.85 (1.75H, m), 2.68 (0.25H, s), 2.3-2.2 (0.75H, m), 2.02-1.89 (1.25H, m), 1.72-1.22 (4.25H, m), 0.7-0.63 (0.75H, m). Viscosity: 290 cPs at 25° C.; density; 1.08 at 25° C.; Refractive index: 1.59 at 23.5° C.

The following Example 3 illustrates the homopolymerization of the monomer of Example 1 by solution vinyl addition polymerization.

Example 3

Homopolymerization of NBEtPhPh

To an appropriately sized reaction vessel equipped with a magnetic stirbar was added NBEtPhPh (5.07 g, 18.5 mmol), toluene (11.4 g), and ethyl acetate (3.04 g). The reactor was sealed and sparged with N$_2$ for 10 minutes. The reactor was brought to temperature (60° C.) with stirring and catalyst solution (NiARF (0.09 g, 0.185 mmol) in toluene (0.77 g), prepared in a glove box) was added in one shot. The reaction was allowed to stir overnight. The reaction mixture was cooled to room temperature followed by addition of acetic acid (2 g), hydrogen peroxide 30% in water (4 g), and water (4 g). The bottle was resealed and vented with two 16 gauge needles and the mixture was allowed to stir overnight at room temperature. The reaction mixture was then transferred to a separatory funnel. The mixture separated into two phases. The organic phase wash washed with water until the water washes reached pH=5. The organic phase was added to stirring hexanes (1 L) in order to precipitate the polymer. The resulting mixture was filtered to collect the solids which were dried overnight at 50° C. under vacuum. The polymer was isolated as a white powder (4 g, 80% yield) with Mw: 50,000 and PDI: 2.09 as determined by GPC.

The following Examples illustrate the mass polymerization of various monomers as described herein utilizing two component approach, Component A and Component B to form transparent films having desirable refractive index and transparency in accordance with this invention.

Example 4

Mass Polymerization of NBEtPhPh/PENB/NBCH$_2$OSiMePh$_2$ (22/68/10 Molar Ratio)

In a vial, NBEtPhPh (2.9 g, 9.1 mmol) was dissolved in PENB (5.7 g, 28.8 mmol) by slight warming of the mixture. To this solution was added the catalyst, palladium bis(tricyclohexylphosphine)diacetate (0.45 mg, 0.0006 mmol), which dissolved to form a clear solution, which was designated as Component A. Into a separate vial, designated as Component B, lithium tetrakis(pentafluorophenyl)-borate etherate (1.5 mg, 0.0017 mmol) was weighed. To this vial was added NBCH$_2$OSiMePh$_2$ (1.4 g, 4.4 mmol). With slight heating, the solid lithium tetrakis(pentafluorophenyl)borate etherate dissolved.

Next the Components A and B were mixed together. The mixture was swirled for a few minutes to aid dissolution. Then the mixture was filtered through a 0.2 μm PTFE syringe filter into a clean room bottle. The solution was then poured onto a 2 inch bare silicon wafer. The wafer was spun at 500 rpm for 10 sec, then 4000 rpm for 30 sec. The wafer was then baked on a hotplate set at 80° C. for 50 min to initiate polymerization.

The above procedure was repeated on a 2 inch quartz wafer using a spin speed of 500 rpm for 40 sec. Visual inspection of the resulting wafer confirmed that the polymer film is transparent in the visible spectrum. The polymer film thickness was determined to range from 6 to 11 microns.

Spectroscopic ellipsometry measurements were performed on the bare silicon coated wafer with a J. A. Woollam M2000V spectroscopic ellipsometer. Data were taken from 350 to 1000 nm in 5 nm increments at incident angles of 55°, 65° and 75°. Using the J. A. Woollam WVASE32 software, the data was modeled using the optical constants contained in the file available from J. A. Woollam ("Ellipsometric determination of optical constants for silicon and thermally grown silicon dioxide via a multi-sample, multi-wavelength, multi-angle investigation", by C. M. Herzinger, et. al., J. Appl. Phys. 1998, 83, 3323) for the bare silicon substrate and a Cauchy model for the transparent polymer film. Using data from all three angles of incidence, the refractive indices were determined as summarized in Table 1.

TABLE 1

| Wavelength (nm) | Refractive index |
|---|---|
| 485 | 1.617 |
| 588 | 1.603 |
| 655 | 1.597 |

Example 5

Mass Polymerization of NBEtPhPh/PENB/NBCH$_2$OSiMePh$_2$ (60/20/20 Molar Ratio)

The procedures of Example 4 were substantially repeated in Example 5, except that a different ratio of monomers was used: NBEtPhPh (3 g, 10.9 mmol), PENB (0.7 g, 3.5 mmol), and NBCH$_2$OSiMePh$_2$ (1.15 g, 3.6 mmol); the amount of catalyst and activator used were: palladium bis(tricyclohexylphosphine)diacetate (0.15 mg, 0.00019 mmol) and lithium tetrakis(pentafluorophenyl)-borate etherate (0.5 mg, 0.00057 mmol).

As in Example 4, both two inch silicon and quartz wafers were coated with a mixture of Components A and B as described in Example 3, and heated to initiate polymerization. Visual inspection of the resulting quartz wafer confirmed that the polymer film is transparent in the visible spectrum. The polymer film thickness was measured and it ranged from 20 to 50 microns. Using ellipsometry as described in Example 4, the refractive indices were determined and are summarized in Table 2.

TABLE 2

| Wavelength (nm) | Refractive index |
|---|---|
| 485 | 1.632 |
| 588 | 1.617 |
| 655 | 1.611 |

The viscosity of the combined monomer mixture of Component A and Component B was determined to be 50-60 cP at 25° C. using a Brookfield DV-I Prime viscometer.

Example 6

Refractive Index of a Homopolymer of NBEtPhPh

The homopolymer of NBEtPhPh of Example 2 was dissolved in 2-heptanone (0.5 g of polymer in 4.5 g of solvent). The solution was filtered through a 0.2 μm PTFE syringe filter into a clean room bottle. The solution was then poured onto a 2 inch bare silicon wafer. The wafer was spun at 500 rpm for 10 sec, then 4000 rpm for 30 sec. The wafer was then baked on a hotplate set at 120° C. for 2 min to remove residual solvent.

The refractive indices of the film were determined by ellipsometry as described in Example 4 and are summarized in Table 3.

TABLE 3

| Wavelength (nm) | Refractive index |
|---|---|
| 485 | 1.633 |
| 588 | 1.616 |
| 655 | 1.609 |

This experiment demonstrates that the homopolymer of NBEtPhPh exhibits a refractive index higher than 1.6 across the visible spectrum. However, the homopolymer of NBEtPhPh may not be used alone in Component A and B of this invention in order to make the transparent film, as NBEtPhPh as a monomer is solid at room temperature, and therefore, it has to be used in combination with another monomer in which it can dissolve to form a clear solution.

Example 7

Mass Polymerization of PENB

This Example 7 demonstrates that a single monomer, such as for example, monomer of formula (II) can be used alone in the composition of this invention to form a transparent film.

PENB (5 g, 15.6 mmol) was weighed into a vial. The procatalyst, palladium bis(tricyclohexylphosphine)diacetate (1.2 mg, 0.00015 mmol), was weighed into a vial. Into a separate vial, lithium tetrakis(pentafluorophenyl)borate etherate (4.4 mg, 0.0051 mmol) was weighed. The catalyst and activator were dissolved in about 0.1 mL of dichloroethane. The PENB was added to the dichloroethane mixture and swirled to dissolve. The solution was filtered through a 0.2 μm PTFE syringe filter into a clean room bottle. The solution was then poured onto a 2 inch bare silicon wafer. The wafer was spun at 500 rpm for 10 sec, then 4000 rpm for 30 sec. The wafer was then heated on a hotplate set at 85° C. for 50 min to initiate polymerization.

The refractive indices of the films thus formed were determined using ellipsometry following the procedures described in Example 4 and are summarized in Table 4.

TABLE 4

| Wavelength (nm) | Refractive index |
|---|---|
| 485 | 1.582 |
| 588 | 1.572 |
| 655 | 1.568 |

Example 8

Mass Polymerization of $NBCH_2OSiMePh_2$

The procedures of Example 7 were substantially repeated in Example 8 except $NBCH_2OSiMePh_2$ (1.15 g, 3.6 mmol) was used instead of PENB.

The refractive indices of the films thus formed were determined using ellipsometry following the procedures as described in Example 4 and are summarized in Table 5.

TABLE 5

| Wavelength (nm) | Refractive index |
|---|---|
| 485 | 1.609 |
| 588 | 1.597 |
| 655 | 1.592 |

Example 9

Mass Polymerization of NBEtPhPh/PENB/NBSi$(OC_2H_5)_3$ (24/67/9 Molar Ratio)

The procedures of Example 4 were substantially repeated in Example 9 except that a different ratio of the title monomers was used: NBEtPhPh (1.5 g, 5.5 mmol), PENB (3.04 g, 15.4 mmol), and NBSi$(OC_2H_5)_3$ (0.52 g, 2 mmol). The amount of catalyst and activator used were: palladium bis(tricyclohexylphosphine)diacetate (3.8 mg, 0.00048 mmol) and lithium tetrakis(pentafluorophenyl)-borate etherate (12 mg, 0.0014 mmol).

As described in Example 4, a two inch silicon wafer was coated with a mixture of Components A and B, and baked to initiate polymerization.

The refractive indices of the film were determined by ellipsometry as described in Example 4 and are summarized in Table 6.

TABLE 6

| Wavelength (nm) | Refractive index |
|---|---|
| 485 | 1.592 |
| 588 | 1.580 |
| 655 | 1.575 |

Example 10

This Example 10 illustrates the mass polymerization of PENB/$NBCH_2OSiMePh_2$ monomers blended with poly(vinyltoluene-co-α-methylstyrene).

Poly(vinyltoluene-co-α-methylstyrene) (Sigma-Aldrich, 1.2 g) was dissolved in PENB (5 g, 25.3 mmol) using a Thinky ARE-310 mixer (2000 rpm for 30 min). The activator, LiFABA (0.0065 g, 0.0075 mmol) was dissolved in NBCH$_2$OSiMePh$_2$ (0.1 g, 0.30 mmol). This mixture was added to the procatalyst, palladium bis(tricyclohexylphosphine)diacetate (0.002 g, 0.0025 mmol). The mixture of poly(vinyltoluene-co-α-methylstyrene) and PENB was added to NBCH$_2$OSiMePh$_2$ solution and swirled to ensure good mixing.

As described in Example 4, a two inch silicon wafer was coated with a mixture and baked to initiate polymerization.

The refractive indices of the film were determined by ellipsometry as described in Example 4 and are summarized in Table 7.

TABLE 7

| Wavelength (nm) | Refractive index |
|---|---|
| 485 | 1.580 |
| 588 | 1.567 |
| 655 | 1.561 |

The film formed from the composition of Example 10 with a film thickness of 1.27 mm exhibited percent transmission of >93 percent between 400 and 700 nm (visible light).

Example 11

Mass Polymerization of NBMeOFMOC/PENB/NBCH$_2$OSiMePh$_2$

A solution of NBMeOFMOC (1.05 g, 2.89 mmol) and PENB (2.67 g, 13.5 mmol) was made by heating the two monomers to 65° C. The activator, LiFABA (0.0050 g, 0.0058 mmol) was dissolved in NBCH$_2$OSiMePh$_2$ (0.93 g, 2.89 mmol). This mixture was added to the procatalyst, palladium bis(tricyclohexylphosphine)diacetate (0.0015 g, 0.0058 mmol) along with the NBMeOFMOC/PENB solution The mixture was swirled to ensure good mixing.

As described in Example 4, a two inch silicon wafer was coated with a mixture and baked to initiate polymerization.

The refractive indices of the film were determined by ellipsometry as described in Example 4 and are summarized in Table 8.

TABLE 8

| Wavelength (nm) | Refractive index |
|---|---|
| 485 | 1.599 |
| 588 | 1.585 |
| 655 | 1.580 |

Example 12

Mass Polymerization of DecNB/NBCH$_2$OSiMePh$_2$ (50/50 Molar Ratio)

DecNB (3.52 g, 15 mmol) was dispensed into a vial. To this monomer was added palladium bis(tricyclohexylphosphine)diacetate (2 mg, 0.003 mmol), which dissolved to form a clear solution, and was designated as Component A. Into a separate vial, designated as Component B, lithium tetrakis(pentafluorophenyl)borate etherate (2 mg, 0.009 mmol) was weighed. To this vial was added NBCH$_2$OSiMePh$_2$ (4.81 g, 15 mmol). With slight heating, the solid lithium tetrakis(pentafluorophenyl)borate etherate dissolved.

Next the Components A and B were mixed together. The mixture was swirled for a few minutes to aid dissolution. Then the mixture was filtered through a 0.2 μm PTFE syringe filter into a clean room bottle. The solution was then poured onto a 2 inch bare silicon wafer. The wafer was spun at 500 rpm for 10 sec, then 4000 rpm for 30 sec. The wafer was then baked on a hotplate set at 80° C. for 60 min to initiate polymerization.

The above procedure was repeated on a 2 inch quartz wafer using a spin speed of 500 rpm for 40 sec. Visual inspection of the resulting wafer confirmed that the polymer film is transparent in the visible spectrum. The polymer film thickness was determined to be 8.8 microns by profilometry.

Spectroscopic ellipsometry measurements were performed on the bare silicon coated wafer with a J. A. Woollam M2000V spectroscopic ellipsometer. Data were taken from 350 to 1000 nm in 5 nm increments at incident angles of 55°, 65° and 75°. Using the J. A. Woollam WVASE32 software, the data was modeled using the optical constants contained in the file available from J. A. Woollam ("Ellipsometric determination of optical constants for silicon and thermally grown silicon dioxide via a multi-sample, multi-wavelength, multi-angle investigation", by C. M. Herzinger, et. al., J. Appl. Phys. 1998, 83, 3323) for the bare silicon substrate and a Cauchy model for the transparent polymer film. Using data from all three angles of incidence, the refractive indices were determined as summarized in Table 9.

TABLE 9

| Wavelength (nm) | Refractive index |
|---|---|
| 485 | 1.582 |
| 588 | 1.570 |
| 655 | 1.565 |

Examples 13-17

Films Obtained from Various Mass Polymerized Homopolymers

In each of these Examples 13-17, the desired amount of the monomer dissolved in toluene as listed in Table 10 were taken in two vials as follows. To one half of the monomer solution was added desired amount of Pd-785 to form a clear solution, which was designated as Component A. Into a separate vial, designated as Component B, the other half of the monomer solution and desired amount of LiFABA were added to form a clear solution. The amounts of monomer, toluene, Pd-785 and LiFABA used in each of these Examples 13-17 are listed in Table 10. In Example 16, a mixture of THF and toluene is used as solvent.

TABLE 10

| Example No. | Monomer | Monomer, g (mmole) | Solvent | Pd-785, mg (mmole) | LiFABA mg (mmole) |
|---|---|---|---|---|---|
| 13 | NBMeOSiPh$_3$ | 5 (13) | 2 g of toluene | 2 (0.0026) | 6.8 (0.008) |
| 14 | NBSi(CH$_3$)$_2$OSiPh$_3$ | 5 (11.7) | 2 g of toluene | 1.8 (0.0023) | 6.1 (0.007) |
| 15 | NBSi(CH$_3$)$_2$OSiPh$_2$CH$_3$ | 5 (13.7) | 2 g of toluene | 2.2 (0.0027) | 7.1 (0.008) |
| 16 | NBMeOCPh$_3$ | 4 (10.9) | 2 g of THF 1 g of toluene | 0.8 (0.0011) | 2.9 (0.003) |
| 17 | NBEtO-1-Naphthyl | 5 (18.9) | 2 g of toluene | 1.5 (0.0019) | 4.9 (0.006) |

Next the Components A and B were mixed together in each of these Examples 13 to 17. In each case the mixture was swirled for a few minutes to aid dissolution. Then the mixture was filtered through a 0.2 μm PTFE syringe filter into a clean room bottle. The solution was then poured onto a 2 inch bare silicon wafer. The wafer was spun at 500 rpm for 10 sec, then 2000 rpm for 30 sec. The wafers were then baked on a hotplate set at 120° C. for 3 hours to initiate polymerization.

The above procedure was repeated on a 2 inch quartz wafer using a spin speed of 500 rpm for 40 sec. Visual inspection of the resulting wafers confirmed that the polymer film in each of the Examples 13 to 17 was transparent in the visible spectrum. The polymer film thickness was determined to range from 6 to 11 microns.

The refractive indices of the films were determined by ellipsometry as described in Example 12 and are summarized in Table 11.

TABLE 11

| | Wavelength (nm) | | |
|---|---|---|---|
| Example No. | 455 | 588 | 655 |
| Example 13 | 1.663 | 1.619 | 1.614 |
| Example 14 | 1.606 | 1.587 | 1.581 |
| Example 15 | 1.604 | 1.587 | 1.582 |
| Example 16 | 1.622 | 1.602 | 1.596 |
| Example 17 | 1.650 | 1.624 | 1.617 |

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. A composition comprising a Component A and a Component B, wherein said Component A and said Component B are kept separate from each other and wherein each of said Component A and said Component B comprises one or more monomers of formula (I) or formula (II) and wherein said Component A further comprises a procatalyst and said Component B further comprises an activator, wherein:

c) said monomer of formula (I) is:

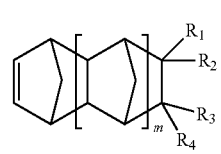

(I)

wherein:
m is an integer 0, 1 or 2;
at least one of $R_1$, $R_2$, $R_3$ and $R_4$ is a group of formula (A):

—X-Aryl   (A)

wherein:
X is selected from the group consisting of:
O, CO, C(O)O, OC(O), OC(O)O, S, $(CR_5R_6)_a$, $O(CR_5R_6)_a$, $(CR_5R_6)_aO$, $(CR_5R_6)_aO(SiR_5R_6)_a$, $(CR_5R_6)_aO(CR_5R_6)_a$, $C(O)(CR_5R_6)_a$, $(SiR_5R_6)_aO(SiR_5R_6)_a$, $(CR_5R_6)_aC(O)$, $C(O)O(CR_5R_6)_a$, $(CR_5R_6)_aC(O)O$, $OC(O)(CR_5R_6)_a$, $(CR_5R_6)_aOC(O)$, $(CR_5R_6)_aOC(O)O$, $(CR_5R_6)_aOC(O)O(CR_5R_6)_a$, $OC(O)O(CR_5R_6)_a$, $S(CR_5R_6)_a$, $(CR_5R_6)_aS$, $(SiR_5R_6)_a$, $O(SiR_5R_6)_a$, $(SiR_5R_6)_aO$, where $R_5$ and $R_6$ are the same or different and each independently represents hydrogen, methyl, ethyl, linear or branched (C$_3$-C$_{12}$)alkyl and (C$_6$-C$_{10}$)aryl, and a is an integer from 0 to 12, inclusive;
Aryl is selected from the group consisting of: substituted or unsubstituted phenyl, substituted or unsubstituted biphenyl, substituted or unsubstituted naphthyl substituted or unsubstituted terphenyl, substituted or unsubstituted anthracenyl and substituted or unsubstituted fluorenyl;
the remaining $R_1$, $R_2$, $R_3$ and $R_4$ are the same or different and each independently selected from the group consisting of: hydrogen, halogen, methyl, ethyl, linear or branched (C$_3$-C$_{12}$)alkyl, perfluoro(C$_1$-C$_{12}$)alkyl, (C$_3$-C$_{12}$)cycloalkyl, (C$_6$-C$_{12}$)bicycloalkyl, (C$_7$-C$_{14}$)tricycloalkyl, (C$_6$-C$_{10}$)aryl, (C$_6$-C$_{10}$)aryl(C$_1$-C$_6$)alkyl, perfluoro(C$_6$-C$_{10}$)aryl and perfluoro(C$_6$-C$_{10}$)aryl(C$_1$-C$_3$)alkyl;

d) said monomer of formula (II) is:

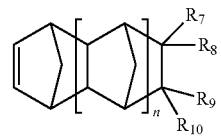

(II)

wherein:

n is an integer 0, 1 or 2;

$R_7$, $R_8$, $R_9$ and $R_{10}$ are the same or different and each independently selected from the group consisting of hydrogen, halogen, methyl, ethyl, linear or branched $(C_3-C_{16})$alkyl, perfluoro$(C_1-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_6)$alkyl, perfluoro$(C_6-C_{10})$aryl, perfluoro$(C_6-C_{10})$aryl$(C_1-C_3)$alkyl and a group of formula (B):

 (B)

wherein:

Y is selected from the group consisting of: $(CR_5R_6)_a$, $O(CR_5R_6)_a$ and $(CR_5R_6)_aO$, where a, $R_5$ and $R_6$ are as defined above;

$Aryl_1$ is phenyl or phenyl substituted with one or more $(C_1-C_6)$alkyl;

and wherein
said monomer of formula (I) is having a refractive index greater than or equal to 1.6 and said Component A and Component B are in a clear liquid form at room temperature.

2. The composition according to claim 1, wherein said Component A comprises at least two monomers wherein first monomer is of formula (I) and second monomer is of formula (II) and is having a refractive index less than 1.6 and viscosity below 100 centipoise, and wherein said first monomer is completely miscible with said second monomer to form a clear solution.

3. The composition according to claim 2, wherein said Component A contains said monomer of formula (I) and said monomer of formula (II) in a molar ratio of from 5:95 to 95:5.

4. The composition according to claim 2, wherein said Component A contains said monomer of formula (I) and said monomer of formula (II) in a molar ratio of from 10:90 to 90:10.

5. The composition according to claim 1, wherein said composition forms a substantially transparent film when Component A and Component B are mixed together at a temperature from 50° C. to 100° C.

6. The composition according to claim 5, wherein said film has a transmission of equal to or higher than 90 percent of the visible light.

7. The composition according to claim 5, wherein said film has a transmission of equal to or higher than 95 percent of the visible light.

8. The composition according to claim 1 further comprising one or more monomers selected from monomer of formula (III) or monomer of formula (IV), wherein said monomer of formula (III) is:

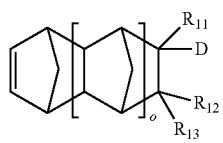 (III)

wherein:

o is an integer from 0 to 2, inclusive;

D is $SiR_{14}R_{15}R_{16}$ or a group of formula (C):

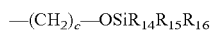 (C); wherein c is an integer from 1 to 10, inclusive, and where one or more of $CH_2$ is optionally substituted with $(C_1-C_{10})$alkyl or $(C_1-C_{10})$perfluoroalkyl;

$R_{11}$, $R_{12}$ and $R_{13}$ are the same or different and independently of each other selected from the group consisting of: hydrogen, halogen, methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_{12})$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C_1-C_3)$alkyl and $(C_6-C_{10})$aryloxy; and $R_{14}$, $R_{15}$ and $R_{16}$ are each independently of one another methyl, ethyl, linear or branched $(C_3-C_9)$alkyl, substituted or unsubstituted $(C_6-C_{14})$aryl, methoxy ethoxy, linear or branched $(C_3-C_9)$alkoxy or substituted or unsubstituted $(C_6-C_{14})$aryloxy;

said monomer of formula (IV) is:

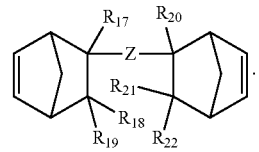 (IV)

wherein:

Z is an arylene selected from the following:

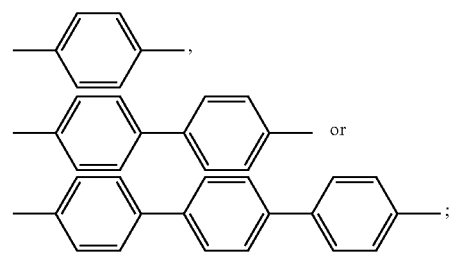

$R_{17}$, $R_{18}$, $R_{19}$, $R_{20}$, $R_{21}$ and $R_{22}$ are the same or different and independently of each other selected from the group consisting of hydrogen, halogen, methyl, ethyl, linear or branched $(C_3-C_{12})$alkyl, $(C_3-C_{12})$cycloalkyl, $(C_6-C_{12})$bicycloalkyl, $(C_7-C_{14})$tricycloalkyl, $(C_6-C_{10})$aryl, $(C_6-C_{10})$aryl$(C_1-C_3)$alkyl, $(C_1-C_2)$alkoxy, $(C_3-C_{12})$cycloalkoxy, $(C_6-C_{12})$bicycloalkoxy, $(C_7-C_{14})$tricycloalkoxy, $(C_6-C_{10})$aryloxy$(C 1-C_3)$alkyl and $(C_6-C_{10})$-aryloxy.

9. The composition according to claim 1, wherein the monomer of formula (I) is selected from the group consisting of:

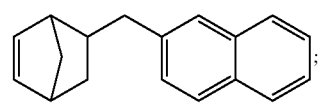

2-(bicyclo[2.2.1]hept-5-en-2-ylmethyl)naphthalene

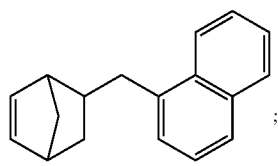

1-(bicyclo[2.2.1]hept-5-en-2-ylmethyl)naphthalene

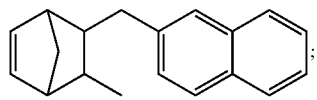

2-((3-methylbicyclo[2.2.1]hept-5-en-2-yl)methyl)naphthalene

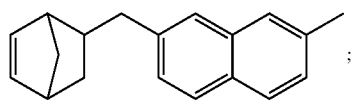

2-(bicyclo[2.2.1]hept-5-en-2-ylmethyl)-7-methylnaphthalene

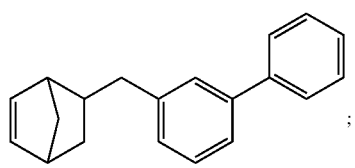

5-([1,1'-biphenyl]-3-ylmethyl)bicyclo[2.2.1]hept-2-ene

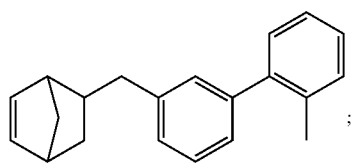

5-((2'-methyl-[1,1'-biphenyl]-3-yl)methyl)bicyclo[2.2.1]hept-2-ene

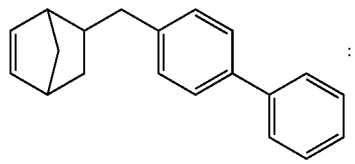

5-([1,1'-biphenyl]-4-ylmethyl)bicyclo[2.2.1]hept-2-ene

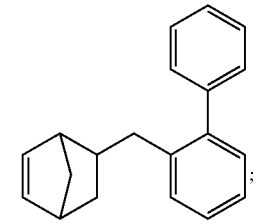

5-([1,1'-biphenyl]-2-ylmethyl)bicyclo[2.2.1]hept-2-ene

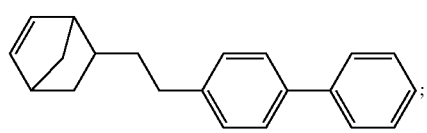

5-(2-([1,1'-biphenyl]-4-yl)ethyl)bicyclo[2.2.1]hept-2-ene (NBEtPhPh)

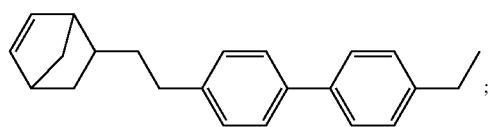

5-(2-(4'-ethyl-[1,1'-biphenyl]-4-yl)ethyl)bicyclo[2.2.1]hept-2-ene

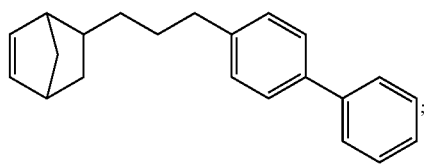

5-(3-([1,1'-biphenyl]-4-yl)propyl)bicyclo[2.2.1]hept-2-ene

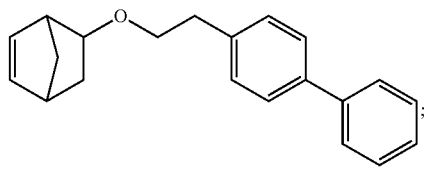

5-(2-([1,1'-biphenyl]-4-yl)ethoxy)bicyclo[2.2.1]hept-2-ene

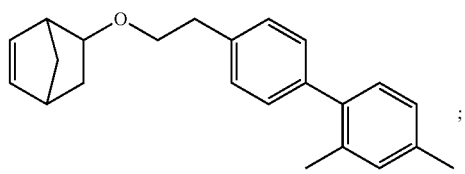

5-(2-(2',4'-dimethyl-[1,1'-biphenyl]-4-yl)ethoxy)bicyclo[2.2.1]hept-2-ene

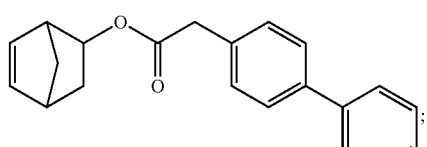

bicyclo[2.2.1]hept-5-en-2-yl 2-([1,1'-biphenyl]-4-yl)acetate

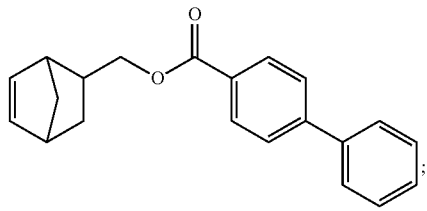

bicyclo[2.2.1]hept-5-en-2-ylmethyl [1,1'-biphenyl]-4-carboxylate

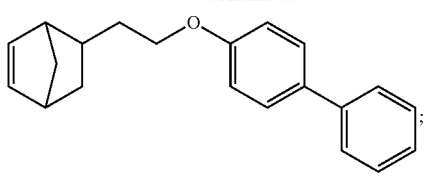

5-(2-([1,1'-biphenyl]-4-yloxy)ethyl)bicyclo[2.2.1]hept-2-ene

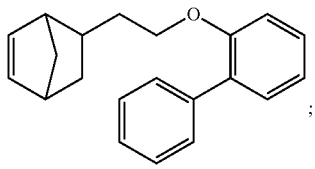

5-(2-([1,1'-biphenyl]-2-yloxy)ethyl)bicyclo[2.2.1]hept-2-ene
(NBEtO-2-PhPh)

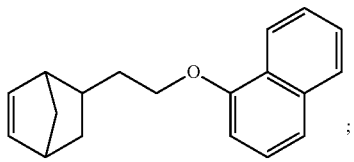

1-(2-(bicyclo[2.2.1]hept-5-en-2-yl)ethoxy)naphthalene
(NBEtO-1-naphthyl)

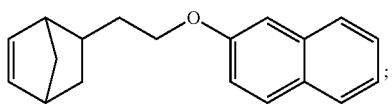

2-(2-(bicyclo[2.2.1]hept-5-en-2-yl)ethoxy)naphthalene
(NBEtO-2-naphthyl)

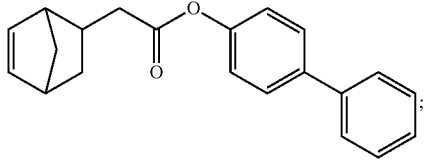

[1,1'-biphenyl]-4-yl 2-(bicyclo[2.2.1]hept-5-en-2-yl)acetate

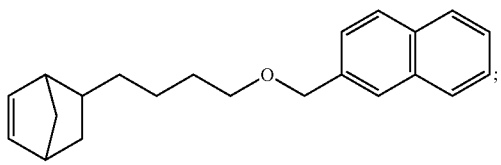

2-((4-(bicyclo[2.2.1]hept-5-en-2-yl)butoxy)methyl)naphthalene

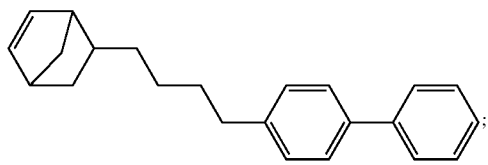

5-(4-([1,1'-biphenyl]-4-yl)butyl)bicyclo[2.2.1]hept-2-ene

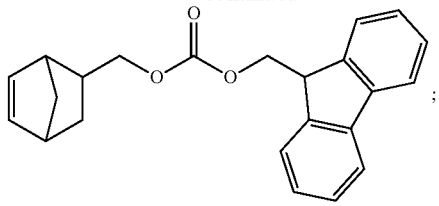

(9H-flouren-9-yl)methyl (bicyclo[2.2.1]hept-5-en-2-ylmethyl) carbonate

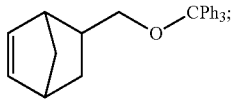

5-((trityloxy)methyl)bicyclo[2.2.1]hept-2-ene
(NBMeOCPh$_3$)

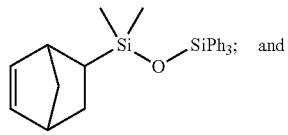

1-(bicyclo[2.2.1]hept-5-en-2-yl)-1,1-dimethyl-3,3,3-triphenyldisiloxane
(NBSi(CH$_3$)$_2$OSiPh$_3$)

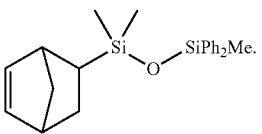

1-(bicyclo[2.2.1]hept-5-en-2-yl)-1,1,3-trimethyl-3,3-diphenyldisiloxane
(NBSi(CH$_3$)$_2$OSiPh$_2$CH$_3$)

10. The composition according to claim 1, wherein the monomer of formula (II) is selected from the group consisting of:

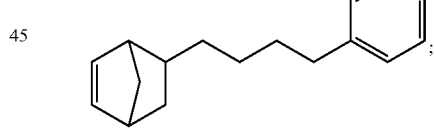

5-(4-phenylbutyl)bicyclo[2.2.1]hept-2-ene

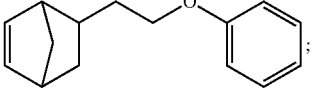

5-(2-phenoxyethyl)bicyclo[2.2.1]hept-2-ene

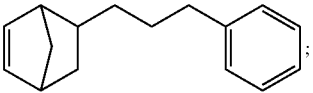

5-(3-phenylpropyl)bicyclo[2.2.1]hept-2-ene

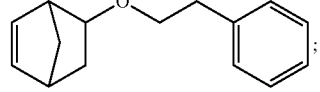

5-phenethoxybicyclo[2.2.1]hept-2-ene

-continued

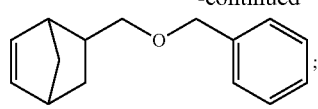

5-((benzyloxy)methyl)bicyclo[2.2.1]hept-2-ene

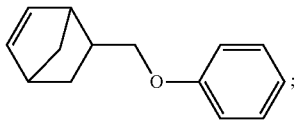

5-(phenoxymethyl)bicyclo[2.2.1]hept-2-ene

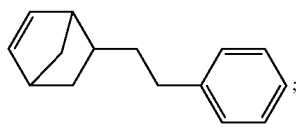

5-phenethylbicyclo[2.2.1]hept-2-ene
(PENB)

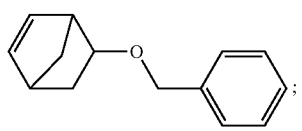

5-(benzyloxy)bicyclo[2.2.1]hept-2-ene

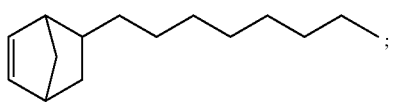

5-octylbicyclo[2.2.1]hept-2-ene
(OctNB)

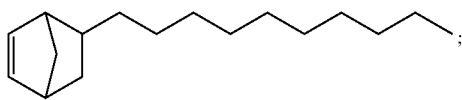

5-decylbicyclo[2.2.1]hept-2-ene
(DecNB)

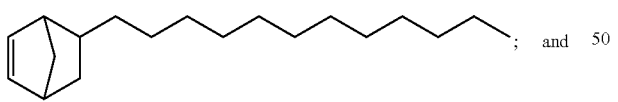; and 5-dodecylbicyclo[2.2.1]hept-2-ene
(DoDecNB)

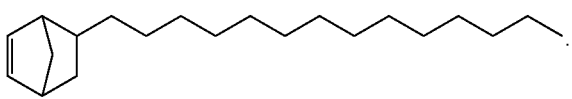.

5-tetradecylbicyclo[2.2.1]hept-2-ene
(TetraDecNB)

11. The composition according to claim 8, wherein the monomer of formula (III) is selected from the group consisting of:

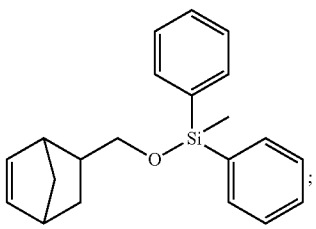

(bicyclo[2.2.1]hept-5-en-2-ylmethoxy)(methyl)diphenylsilane
(NBCH₂OSiMePh₂)

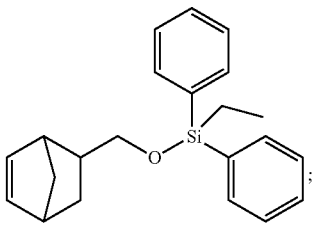

(bicyclo[2.2.1]hept-5-en-2-ylmethoxy)(ethyl)diphenylsilane

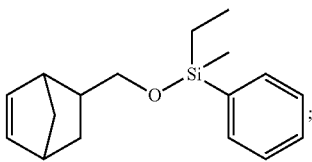

(bicyclo[2.2.1]hept-5-en-2-ylmethoxy)(ethyl)(methyl)(phenyl)silane

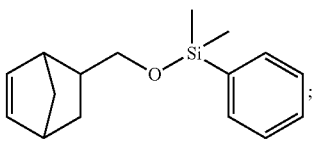

(bicyclo[2.2.1]hept-5-en-2-ylmethoxy)dimethyl(phenyl)silane

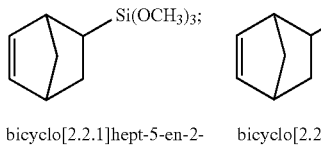

bicyclo[2.2.1]hept-5-en-2-yltrimethoxysilane  bicyclo[2.2.1]hept-5-en-2-yltriethoxysilane
(TESNB, NBSi(OC₂H₅)₃)

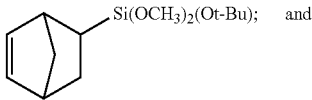

bicyclo[2.2.1]hept-5-en-2-yl(tert-butoxy)dimethoxysilane

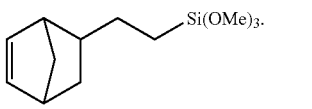

(2-(bicyclo[2.2.1]hept-5-en-2-yl)ethyl)trimethoxysilane

12. The composition according to claim 8, wherein the monomer of formula (IV) is selected from the group consisting of:

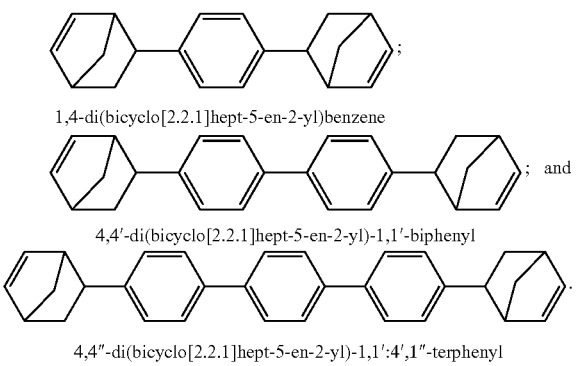

1,4-di(bicyclo[2.2.1]hept-5-en-2-yl)benzene 4,4′-di(bicyclo[2.2.1]hept-5-en-2-yl)-1,1′-biphenyl 4,4″-di(bicyclo[2.2.1]hept-5-en-2-yl)-1,1′:4′,1″-terphenyl 13. The composition according to claim 1, wherein the procatalyst is selected from the group consisting of:
palladium (II) bis(triphenylphosphine) dichloride;
palladium (II) bis(triphenylphosphine) dibromide;
palladium (II) bis(triphenylphosphine) diacetate;
palladium (II) bis(triphenylphosphine) bis(trifluoroacetate);
palladium (II) bis(tricyclohexylphosphine) dichloride;
palladium (II) bis(tricyclohexylphosphine) dibromide;
palladium (II) bis(tricyclohexylphosphine) diacetate;
palladium (II) bis(tricyclohexylphosphine) bis(trifluoroacetate);
palladium (II) bis(tri-p-tolylphosphine) dichloride;
palladium (II) bis(tri-p-tolylphosphine) dibromide;
palladium (II) bis(tri-p-tolylphosphine) diacetate;
palladium (II) bis(tri-p-tolylphosphine) bis(trifluoroacetate);
palladium (II) ethyl hexanoate;
dichloro bis(acetonato)palladium (II);
dichloro bis(benzonitrile)palladium (II);
platinum (II) chloride;
platinum (II) bromide; and
platinum bis(triphenylphosphine)dichloride.

14. The composition according to claim 1, wherein the activator is selected from the group consisting of:
lithium tetrafluoroborate;
lithium triflate;
lithium tetrakis(pentafluorophenyl)borate;
lithium tetrakis(pentafluorophenyl)borate etherate;
lithium tetrakis(pentafluorophenyl)borate isopropanolate;
lithium tetraphenylborate;
lithium tetrakis(3,5-bis(trifluoromethyl)phenyl)borate;
lithium tetrakis(2-fluorophenyl)borate;
lithium tetrakis(3-fluorophenyl)borate;
lithium tetrakis(4-fluorophenyl)borate;
lithium tetrakis(3,5-difluorophenyl)borate;
lithium hexafluorophosphate;
lithium hexaphenylphosphate;
lithium hexakis(pentafluorophenyl)phosphate;
lithium hexafluoroarsenate;
lithium hexaphenylarsenate;
lithium hexakis(pentafluorophenyl)arsenate;
lithium hexakis(3,5-bis(trifluoromethyl)phenyl)arsenate;
lithium hexafluoroantimonate;
lithium hexaphenylantimonate;
lithium hexakis(pentafluorophenyl)antimonate;
lithium hexakis(3,5-bis(trifluoromethyl)phenyl)antimonate;
lithium tetrakis(pentafluorophenyl)aluminate;
lithium tris(nonafluorobiphenyl)fluoroaluminate;
lithium (octyloxy)tris(pentafluorophenyl)aluminate;
lithium tetrakis(3,5-bis(trifluoromethyl)phenyl)aluminate; and
lithium methyltris(pentafluorophenyl)aluminate.

15. The composition according to claim 1, wherein said Component A contains 5-(2-([1,1′-biphenyl]-4-yl)ethyl)bicyclo[2.2.1]hept-2-ene (NBEtPhPh), 5-phenethylbicyclo[2.2.1]hept-2-ene (PENB) and palladium bis(tricyclohexylphosphine) diacetate; and said Component B contains (bicyclo[2.2.1]hept-5-en-2-ylmethoxy)(methyl)diphenylsilane (NBCH$_2$OSiMePh$_2$) and lithium tetrakis(pentafluorophenyl)borate etherate.

16. The composition according to claim 1, wherein said Component A contains 5-(2-([1,1′-biphenyl]-4-yl)ethyl)bicyclo[2.2.1]hept-2-ene (NBEtPhPh), 5-phenethylbicyclo[2.2.1]hept-2-ene (PENB) and palladium bis(tricyclohexylphosphine) diacetate; and said Component B contains norbornene triethoxysilane (NBSi(OC$_2$H$_5$)$_3$) and lithium tetrakis(pentafluorophenyl)borate etherate.

17. The composition according to claim 1, wherein said Component A contains 5-decylbicyclo[2.2.1]hept-2-ene (DecNB) and palladium bis(tricyclohexylphosphine) diacetate; and said Component B contains (bicyclo[2.2.1]hept-5-en-2-ylmethoxy)(methyl)diphenylsilane (NBCH$_2$OSiMePh$_2$) and lithium tetrakis(pentafluorophenyl)borate etherate.

18. The composition according to claim 1, wherein each of said Component A and Component B contains a monomer selected from the group consisting of (bicyclo[2.2.1]hept-5-en-2-ylmethoxy)triphenylsilane (NBMeOSiPh$_3$), 1-(bicyclo[2.2.1]hept-5-en-2-yl)-1,1-dimethyl-3,3,3-triphenyldisiloxane (NBSi(CH$_3$)$_2$OSiPh$_3$), 1-(bicyclo[2.2.1]hept-5-en-2-yl)-1,1,3-trimethyl-3,3-diphenyldi-siloxane (NBSi(CH$_3$)$_2$OSiPh$_2$CH$_3$), 5-((trityloxy)methyl)bicyclo[2.2.1]hept-2-ene (NBMeOCPh$_3$) and 1-(2-(bicyclo[2.2.1]hept-5-en-2-yl)ethoxy)naphthalene (NBEtO-1-Naphthyl), each of said monomer dissolved in toluene or a mixture of toluene and tetrahydrofuran; and Component A further contains palladium bis(tricyclohexylphosphine) diacetate; and Component B further contains lithium tetrakis(pentafluorophenyl)borate etherate.

19. The composition according to claim 1, wherein said Component A or Component B further comprises a polymer selected from the group consisting of poly(α-methylstyrene), poly(vinyl-toluene) and a copolymer of α-methylstyrene and vinyl-toluene.

20. The composition according to claim 19, wherein said Component A contains 5-phenethylbicyclo[2.2.1]hept-2-ene (PENB), poly(vinyltoluene-co-α-methylstyrene) and palladium bis(tricyclohexylphosphine) diacetate; and said Component B contains (bicyclo[2.2.1]hept-5-en-2-ylmethoxy)(methyl)diphenylsilane (NBCH$_2$OSiMePh$_2$) and lithium tetrakis(pentafluorophenyl)borate etherate.

* * * * *